(12) United States Patent
Li et al.

(10) Patent No.: US 7,863,632 B2
(45) Date of Patent: Jan. 4, 2011

(54) HIGH PERFORMANCE LIGHT-EMITTING DEVICES

(75) Inventors: Li Li, Ottawa (CA); Jerzy Dobrowolski, Ottawa (CA); Daniel Poitras, Ottawa (CA)

(73) Assignee: National Research Council of Canada, Ottawa, Ontario (CA)

( * ) Notice: Subject to any disclaimer, the term of this patent is extended or adjusted under 35 U.S.C. 154(b) by 936 days.

(21) Appl. No.: 11/573,774

(22) PCT Filed: Aug. 23, 2004

(86) PCT No.: PCT/CA2004/001553
§ 371 (c)(1),
(2), (4) Date: Feb. 15, 2007

(87) PCT Pub. No.: WO2006/021070
PCT Pub. Date: Mar. 2, 2006

(65) Prior Publication Data
US 2007/0246705 A1    Oct. 25, 2007

(51) Int. Cl.
H01L 33/00    (2010.01)
H01L 21/00    (2010.01)
(52) U.S. Cl. .................. 257/98; 257/E51.022; 438/29
(58) Field of Classification Search .............. 438/29; 257/E51.022, 98
See application file for complete search history.

(56) References Cited

U.S. PATENT DOCUMENTS 5,834,893 A * 11/1998 Bulovic et al. ............. 313/506
2004/0147200 A1* 7/2004 Urabe et al. ................ 445/24
2004/0227460 A1* 11/2004 Liao et al. .................. 313/506

OTHER PUBLICATIONS

Boo et al. "Optical Properties of Microcavity Structures Using the Organic Light Emitting materials", Mat. Res. Soc. Symp. Proc. vol. 621, Materials Research Society, 2001.
Burrows et al. "Achievement Full-Color Organic Light-Emitting Devices for Lightweight, Flat-Panel Displays", IEEE Transactions on Electron Devices, vol. 44, No. 8, Aug. 1997.

* cited by examiner

Primary Examiner—Hsien-ming Lee
Assistant Examiner—Kevin Parendo
(74) Attorney, Agent, or Firm—Marks & Clerk

(57) ABSTRACT

An organic light emitting device consists of a layered structure including a top multilayer stack, a bottom multilayer stack, a cavity layer between the top multilayer stack and the bottom multilayer stack, and an organic light emitting region within the cavity layer. The layered structure is constructed such that the product of phase factors $\xi_1$ and $\xi_2$ is greater than 80% at the center of at least one emitting wavelength region and for a normal viewing angle, wherein where $R_a^-$ and $R_b^+$ are the reflectance of the top and bottom multilayer stacks respectively, $\phi_a^-$ and $\phi_b^+$ are the phase changes on reflection for the top and bottom multilayer stacks respectively, $\alpha_1$ $\beta_1$ are respectively the real and imaginary parts of the phase thickness of the cavity layer, $\alpha_2$ and $\beta_2$ are respectively the real and imaginary parts of the phase thickness of the light-emitting region at the operating wavelength of the device, x is the mean distance of light emitting region from the bottom multilayer stack, n and k are the refractive index and absorption coefficient of the cavity layer, $\theta_{cavity}$ is the emitting angle inside the cavity layer, and d is the physical thickness of said cavity layer. This condition improves the light output efficiency of the device.

32 Claims, 33 Drawing Sheets

HIGH PERFORMANCE LIGHT-EMITTING DEVICES

FIELD THE INVENTION

This invention relates to the field of light emitting devices, and more particularly to light emitting diodes or displays, wherein a light-emitting layer is sandwiched between top and bottom multilayer stacks. The invention is primarily, but not necessarily exclusively applicable to OLEDs (Organic Light Emitting Diodes).

BACKGROUND OF THE INVENTION

Unlike liquid crystal displays (LCDs), OLEDs are emissive displays and do not require backlighting. They are made of mostly organic materials and thus have the advantage of potentially low manufacturing cost, full color capability, light weight and flat structure. They can be used as flat panel displays in many applications such as computer monitors, personal assistant devices, automobile displays, etc.

A basic OLED device as shown in FIG. 1 consists of a transparent substrate 16 made of glass or plastic, a transparent anode layer 21 such as ITO (indium tin oxide), an organic hole transport layer (HTL) 20, such as N,N'-diphenyl-N,N'-bis(3-methylphenyl)(1,1'-biphenyl)-4,4'-diamine (TPD) or N,N'-bis(I-naphthyl)-N,N'-diphenyl-1,1'-biphenyl-4,4'-diamine (NPB), a light emitting organic layer 10, such as tris (8-hydroxyquinolinato)aluminum ($Alq_3$), which is also an electron transport (ETL) layer, a cathode 23 made of metal or metal alloys, such as Al, Mg, Mg:Ag and an optional cover glass 24. When a voltage is applied between the cathode and the anode, electrons and holes are injected respectively from the cathode into the ETL layer and from the anode into the HTL layer. The injected electrons and holes migrate towards each other because of the electrical potential between the anode and the cathode, and recombine inside the ETL layer near the interface between the ETL and HTL layers. As a result, energy is released in the form of electroluminescent light, which exits through the transparent substrate. The color of the emitted light is determined by the energy band gap of the emitting layer. In the case of $Alq_3$, usually green color light centered at 530 nm is emitted. Different colors of emitting light can be obtained by using different organic emitting layers, or by doping the same organic emitting layer with different color dyes. White emitting light can be achieved by doping the emitting layer with red (R), green (G) and blue (B) dyes or by stacking R, G, and B emitting layers on top of each other. Full color displays can be realized in several approaches as described in detail in a paper by Burrows et al. in the *IEEE Transactions on Electron Devices*, Vol. 44, No. 8, 1997, p. 1188-1203. Among these approaches, using three color pixels, red (R), green (G) and blue (B) to form a full color pixel is rather simple and has been commonly used in other direct view flat panel displays such as LCDs.

Unlike thin film electroluminescent displays (TFELs), OLEDs are current-driven devices. The amount of light emitted is directly linked to how much current is passing through the device. Usually, the higher the current, the more light is emitted and the brighter the displays are. Unfortunately, two major problems with current OLED devices are their short lifetime and poor stability, problems that are both directly linked to the driving current. The performance of an OLED degrades quickly when it is driven at a high current level and so does its lifetime. Thus, if the efficiency of the OLEDs can be enhanced, then the driving current can be reduced, and the lifetime and stability of the OLED devices can be improved as well.

The efficiency of the OLEDs is mainly affected by two factors: the internal quantum efficiency and the external extraction efficiency. The first factor indicates how many electrons or holes can be generated and how many of them can recombine and emit photons in the desired spectrum. This factor is determined by the choice of OLED materials and structures, such as the cathode, anode, electron and hole transport layers, etc. The external extraction efficiency indicates how much generated light exits the OLED structure. This factor is mainly determined by the optical thin film structure of the OLEDs, such as the refractive indices and layer thicknesses of all layers in the OLED structure. It is well known that an OLED structure resembles that of a Fabry-Perot microcavity that has been extensively used in solid-state light emitting diodes (LEDs) and vertical cavity surface emitting lasers (VCSELs). But unlike those in LEDs and VCSELs, the cavity effect in OLEDs is much weaker due to the low reflectance of the top layer structure including the hole transport layer and the anode. Many efforts have been made to improve the extraction efficiency of OLEDs by increasing the cavity effect using mirrors with higher reflectance. Such effort did result in the enhancement of the peak wavelength emission in OLEDs; unfortunately, this enhancement is often accompanied by the reduction of the emission at other wavelengths, the width of the emission wavelength band and the viewing angle. These side effects are not desired in display applications, which usually require viewing angles larger than ±60° and an emission bandwidth covering the whole visible spectrum region (400-700 nm).

Furthermore, the cathodes used in OLEDs are often made of metals or metal alloys having high reflectivity. They strongly reflect ambient light and as a result significantly reduce the contrast of OLED devices when they are viewed under strong ambient light illumination. Many methods have been suggested to improve the contrast of OLEDs devices. One approach is to use expensive circular polarizers that allow at most 37% of the emitted light to pass through. Another approach is to use black layers to reduce the reflectance of the cathodes. In particular, the thin film interference black layer approach, first disclosed in U.S. Pat. No. 5,049,780 by Dobrowolski et al. and successfully applied to thin film electroluminescent devices, has been recently applied to OLEDs in several US patents, for example, U.S. Pat. No. 6,411,019, U.S. Pat. No. 6,551,651, U.S. Pat. No. 6,429,451, and U.S. Pat. No. 6,608,333. If a perfect black layer with zero reflectance was used, then there would be no cavity effects at all, and the amount of light emitted from such an OLED device would be about four times less than that of a similar OLED device having a conventional cathode with a high reflectance. Furthermore, if the black coating is not perfect and has some residual reflectance, which is often the case in real life, the residual reflectance could result in a cavity effect. The emission can be either enhanced or reduced by this cavity effect, depending on the critical factors of the phase changes on reflection of the two mirror structures. The phase changes on reflection are not considered in the above US patents. In addition, such interference black layer coatings described in these patents require the use of at least one transparent (or semi-transparent) layer and one absorbing layer, all inserted between the conventional metal cathode and the emitting layer. In OLEDs these added layers are required to be conductive and the layer next to the organic emitting layer is required to have a low work function (preferably <4 eV) in order to allow electrons to be injected easily into the emitting layer. The number of transparent conducting materials is limited and these often have high work functions (e.g. 4.4-4.8 eV for ITO) and thus are not suitable to be used next to the emitting layer on the cathode side. In addition, the fabrication of transparent, dense and high-conductivity materials usually requires high-temperature deposition, which is not acceptable when depositing on organic materials, most of them being temperature sensitive. Low-temperature deposited transparent materials have been used for the fabrication of interference black layer coated cathodes. In addition, semi-transparent metal/dielectric mixtures have been proposed to replace the transparent layer in the thin film interference black layers for OLED devices. Such replacements result in poorer black layer performance than those used in TFELs because their optical constants are less suitable for the design of lower-reflectance black layer coatings. Moreover, these semi-transparent layers are deposited by the simultaneous evaporation of metal and dielectric materials. The properties of these co-deposited layers, such as their conductivities and optical constants, vary greatly with the deposition rates of the two materials [Han et al. *J. Appl. Phys.* 96, 709 (2004)], and so the performance of the OLEDs incorporating such black layers will be also be affected. Furthermore, such black layer coatings are not effective in reducing the light reflected from other interfaces of the OLED devices.

SUMMARY OF THE INVENTION

According to the present invention there is provided a light emitting device comprising a layered structure comprising a top multilayer stack, a bottom multilayer stack, and a cavity layer between said top multilayer stack and said bottom multilayer stack; an organic light emitting region within said cavity layer; and wherein said layered structure is constructed such that the product of phase factors $\xi_1$ and $\xi_2$ is greater than 80% at the center of at least one emitting wavelength region and for a normal viewing angle, wherein $$\xi_1 = \left(1 + \frac{4\sqrt{R_a^- R_b^+} \sin^2\left(\alpha_1 - \frac{\varphi_a^- + \varphi_b^+}{2}\right) e^{-2\beta_1}}{\left(1 - \sqrt{R_a^- R_b^+}\, e^{-2\beta_1}\right)^2}\right)^{-1}$$

$$\xi_2 = 1 - \frac{4\sqrt{R_b^+} \sin^2\left(\alpha_2 - \frac{\varphi_b^+}{2}\right) e^{-2\beta_2}}{\left(1 + \sqrt{R_b^+}\, e^{-2\beta_2}\right)^2} \text{ and}$$

where $R_a^-$ and $R_b^+$ are the reflectance of the top and bottom multilayer stacks respectively, $\phi_a^-$ and $\phi_b^+$ are the phase changes on reflection for the top and bottom multilayer stacks respectively, $\alpha_1$ and $\beta_1$ are respectively the real and imaginary parts of the phase thickness of said cavity layer, $\alpha_2$ and $\beta_2$ are respectively the real and imaginary parts of the phase thickness of said light-emitting region at the operating wavelength of the device, x is the mean distance of light emitting region from the bottom multilayer stack, n and k are the refractive index and absorption coefficient of said cavity layer, $\theta_{cavity}$ is the emitting angle inside the cavity layer, and d is the physical thickness of said cavity layer.

The invention is primarily concerned with OLEDs, where the light emitting material is organic, but it would be applicable to any device of similar structure having a light emitting region within a layered structure.

For any given OLED it will be possible to determine whether it satisfies this criterion. An OLED that satisfies this criterion will have enhanced properties relative to the prior art due to the improved efficiency of the light emission from the device. Prior art devices wherein the thickness of the layers was not calculated to optimize light efficiency had a product of phase factors $\xi_1$ and $\xi_2$ of less than 80%. Preferably, this product should be 90%, and optimally 95%, or more. It will be appreciated that although for convenience the OLEDs in accordance with the invention are described as having top and bottom multilayer stacks, they can be oriented in any manner. However, it will always be possible to orient a device in a manner consistent with the present disclosure.

The invention permits high efficiency OLED devices to be obtained by correctly selecting the layer thickness of each layer of an OLED structure to maximize the external extraction efficiency without significantly affecting the internal quantum efficiency.

Even higher efficiency OLED devices can be obtained in accordance with the invention by introducing additional thin film layers that take advantage of the microcavity enhancement effect and that at the same time minimize the common problems of the reduction of the angular field and of the bandwidth.

In another embodiment high efficiency and high contrast OLED devices are obtained by introducing additional thin film layers that take advantage of the microcavity effect and which simultaneously minimize the reflectance not only of the cathode layer but also of the whole OLED structure and which also reduce the problem of the narrowing of the angular field and of the bandwidth.

BRIEF DESCRIPTION OF THE DRAWINGS

The invention will now be described in more detail, by way of example only, with reference to the accompanying drawings, in which.

DETAILED DESCRIPTION OF THE INVENTION

Optical Modeling of Electroluminescent Displays

Correct optical modeling of organic light emitting devices is critical for the present invention. Unlike in the situation used in the prior art, the model used in the present invention for calculating light extracted from a OLED structure is rather complete and takes into account the absorption and dispersion of all layers within the OLED structures; thus, it gives more accurate results.

Figure 1:
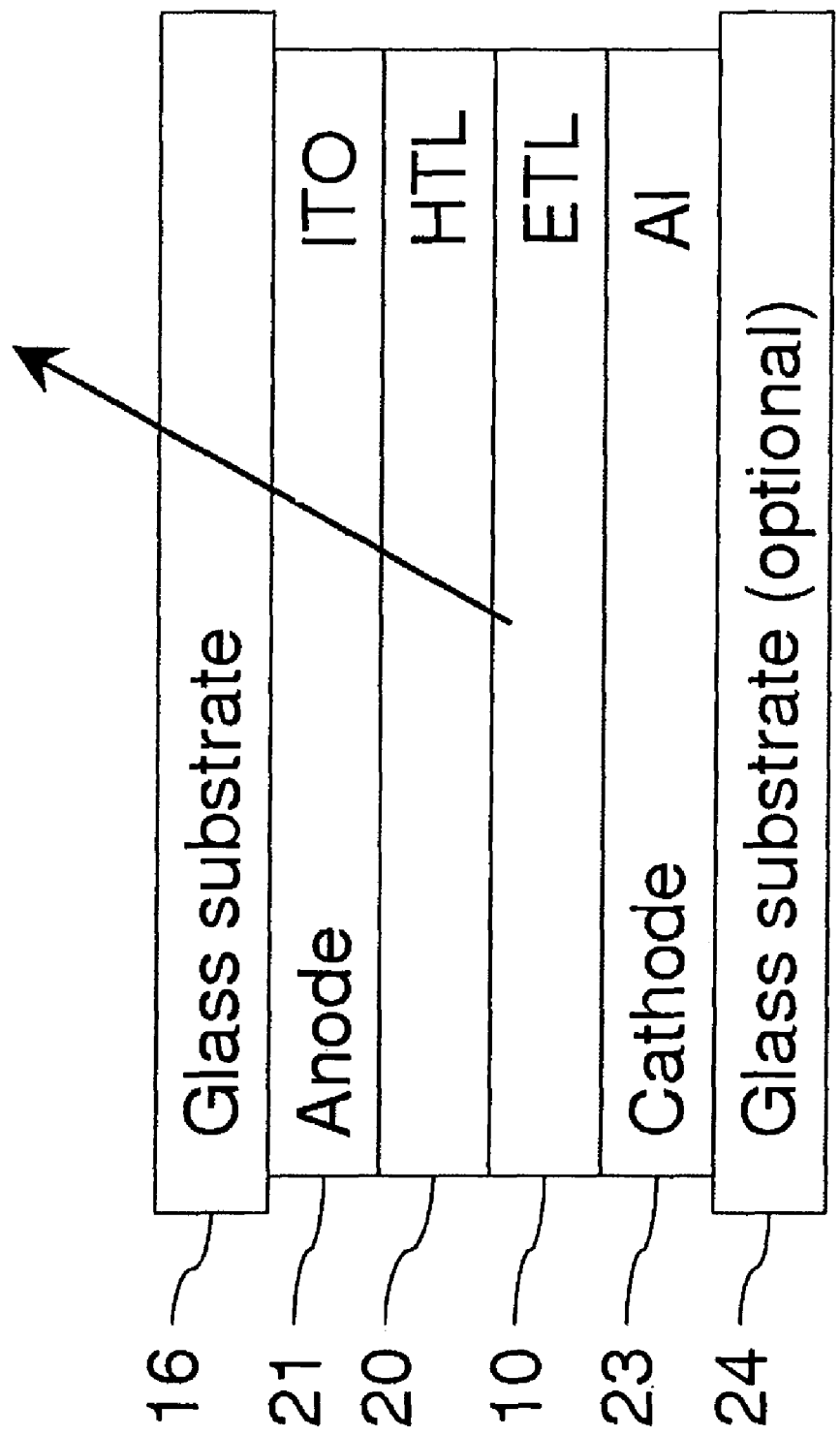
FIG. 1 is a cross-sectional view of the basic structure of a conventional OLED.
Figure 2:
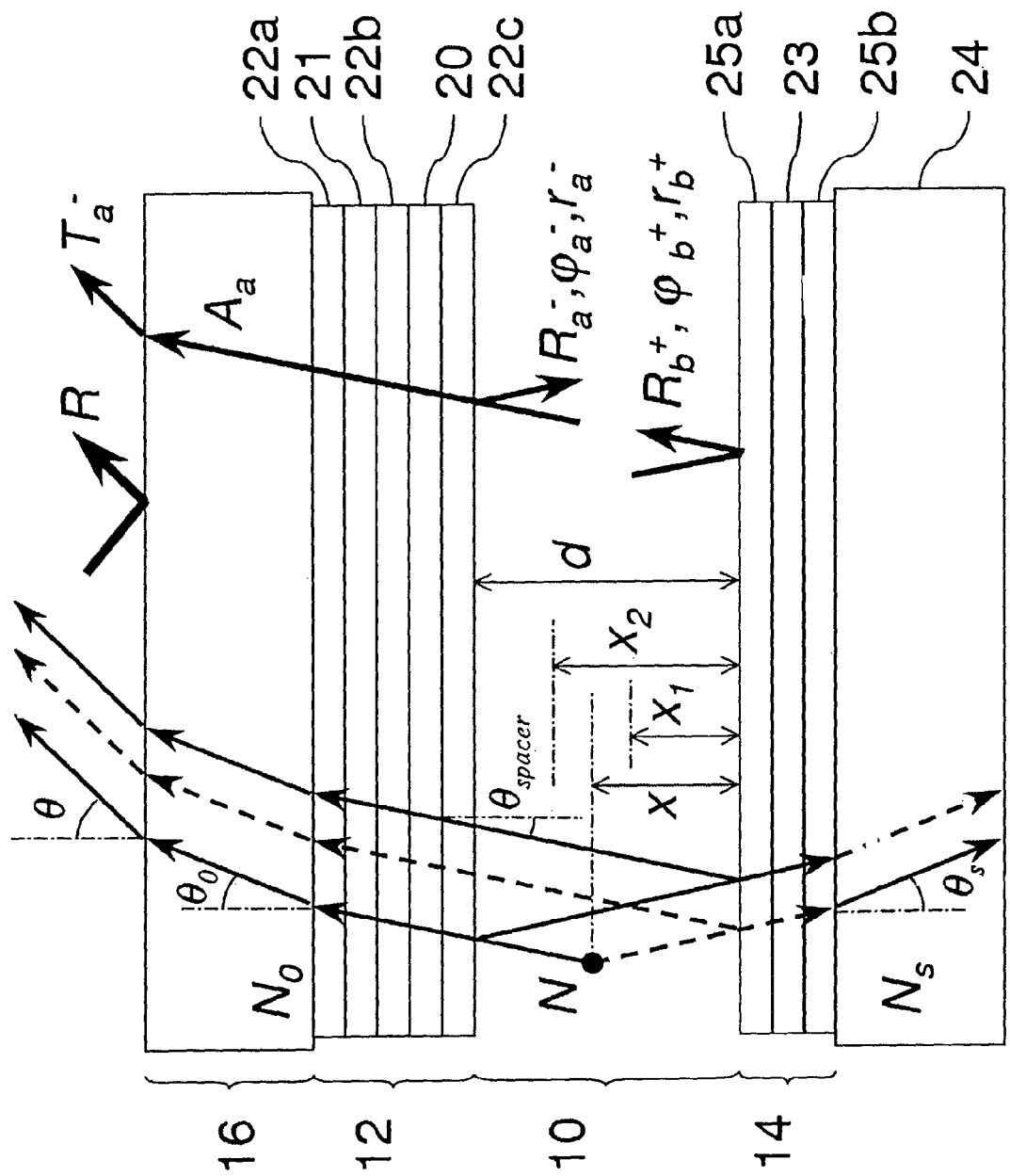
FIG. 2 is a cross-sectional view of the OLED structure in accordance with the present invention.

The OLED structure in accordance with embodiments of the present invention can be treated as a Fabry-Perot cavity in which light is emitted from the insides of the structure as shown in FIG. 2. The emitting layer 10 is also the electron transport layer (consisting of a small-molecule or a polymer organic material, for example undoped or doped $Alq_3$, AlOq, TPBI, and it contains a light-emitting region between planes $x_1$, $x_2$. The cavity layer 10 is sandwiched between the top and bottom multilayer stacks 12, 14. Light is emitted by the cavity layer 10 and passes through the top multilayer stack 12 and the transparent substrate 16. The top multilayer stack 12 consists of at least a hole-transport or hole-injection layer 20 (consisting of materials such as NPB, TPD, CuPC (copper phthalocyanine), PEDOT/PSS, PVK, TPBI, spiro-linked materials, etc.), and a transparent anode 21 (typically ITO, or any other transparent conductor) on a supporting transparent substrate 16, and other optional functional layer groups 22a, 22b, 22c, either before or after the transparent anode, for increasing internal reflectance of the top layer stack 12 and hence enhancing the external extraction efficiency or reducing external reflectance from the OLED structure hence enhancing the contrast of the device, or assisting or controlling hole transport process. The bottom multilayer stack consists of at least one cathode 23 consists of at least one electron-injection material, for example Mg:Ag, LiF on Al, or Ca) supported by an optional substrate 24 that could be transparent or opaque, and other optional functional layer groups. 25a, 25b, for reducing reflectance from the cathode hence enhancing the contrast of the OLED device or assisting or controlling electron transport. The cavity layer 10 is also called the emitting layer or the spacer layer or the electron transport layer. All four terms are used in the present invention and they are interchangeable.

The optional functional layer groups 22b, 22c and 25a may consist of plurality of layers made of conducting materials. Any layers between the anode 21 and the cathode 23 need to be substantially conducting in order to ensure continuity of current between the anode and the cathode. The optional functional layer groups 22a and 25b can be made of dielectric, conducting or semi-conducting materials.

The spacer layer 10 has a layer thickness d and a complex refractive index $N = n - ik$, where n is the refractive index and k is the extinction coefficient. The OLED layer structure can be supported by a transparent substrate with a refractive-index $N_0$ at the top of the upper layer stack. Alternatively, it can be supported by a substrate with a refractive index $N_S$ that is either transparent or opaque at the bottom of the lower layer stack. When voltage is applied to the cathode and anode, electrons and holes migrate towards each other and recombine inside the ETL layer 10 and result in the emission of light. Usually the light is only emitted from a narrow region within the ETL 10 defined by the distance $x_1$ and $x_2$ (FIG. 2). The amount of light, that can pass through the substrate 16 and thus can be seen, is derived in the following paragraphs.

The transmission coefficient $t_e$ for light emitted from a plane at a distance x from the bottom stack can be expressed as:

$$t_e^+ = \frac{t_a^- (1 + r_b^+ e^{-i2\delta_2}) e^{-i\frac{\delta_1 - \delta_2}{\cos^2 \theta}}}{1 - r_a^- r_b^+ e^{-2i\delta_1}}. \tag{1}$$

Here $t_a^-$ and $r_a^-$, are the amplitude transmission and reflection coefficients of the top layer stack 12 for light emitted from the spacer layer towards the substrate $N_0$, and $r_b^+$ is reflection coefficient of the bottom layer stack 14 for light emitted from the spacer layer towards the substrate $N_s$. For the purposes of the calculations, the plane x is assumed to be the mean distance from the top of the bottom stack of the light emitting region. The phase thicknesses $\delta_1$ and $\delta_2$ for light emitted at an angle of $\theta_{cavity}$ inside the spacer layer 10 are defined by:

$$\begin{cases} \delta_1 = \frac{2\pi}{\lambda}(n - ik)d\cos\theta_{cavity} = \frac{2\pi}{\lambda}nd\cos\theta_{cavity} - i\frac{2\pi}{\lambda}kd\cos\theta_{cavity} = \\ \qquad \alpha_1 - i\beta_1 \\ \delta_2 = \frac{2\pi}{\lambda}(n - ik)x\cos\theta_{cavity} = \frac{2\pi}{\lambda}nx\cos\theta_{cavity} - i\frac{2\pi}{\lambda}kx\cos\theta_{cavity} = \\ \qquad \alpha_2 - i\beta_2. \end{cases} \tag{2}$$

The intensity transmittance $T_e$ for light emitted from the emitting plane is then:

$$T_e^+ = T_a^- e^{-\frac{\beta_1 - \beta_2}{\cos^2\theta}} \frac{\left(1 + \sqrt{R_b^+}\, e^{-2\beta_2}\right)^2 - 4\sqrt{R_b^+} \sin^2\!\left(\alpha_2 - \frac{\varphi_b^+}{2}\right) e^{-2\beta_2}}{\left(1 - \sqrt{R_a^- R_b^+}\, e^{-2\beta_1}\right)^2 + 4\sqrt{R_a^- R_b^+} \sin^2\!\left(\alpha_1 - \frac{\varphi_a^- + \varphi_b^+}{2}\right) e^{-2\beta_1}}, \tag{3}$$

where $\phi_a^-$ and $\phi_b^+$ are the phase changes on internal reflection for $r_a^-$ and $r_b^+$, respectively. $T_a^-$ and $R_a^-$ are the transmittance of the top layer stack and the internal reflectance of the top layer stack for light incident from the cavity layer to the top layer stack and $R_b^+$ is the internal reflectance of the bottom layer stack for light incident from the cavity layer to the bottom layer stack. They are given by:

$$\begin{cases} \varphi_a^- = \text{argument}(r_a^-) \\ \varphi_b^+ = \text{argument}(r_b^+) \\ T_a^- = \frac{\text{Re}(N_0)}{\text{Re}(N)} t_a^- (t_a^-)^* \\ R_a^- = r_a^- (r_a^-)^* \\ R_b^+ = r_b^+ (r_b^+)^* \end{cases} \tag{4}$$

The above transmittance of the emitting structure $T_e$ can be written in a simpler form:

$$T_e^+ = T_{emax} \xi_1 \xi_2 \tag{5}$$

where $\xi_1$ and $\xi_2$ are the two phase factors with values always being between zero and unity and $T_{emax}$ is the maximum transmittance that can be obtained when both $\xi_1$ and $\xi_1$ reach unity. They are given by:

$$T_{emax} = \frac{\left(1 + \sqrt{R_b^+}\, e^{-2\beta_2}\right)^2 T_a^- e^{-\frac{\beta_1 - \beta_2}{\cos^2\theta_{cavity}}}}{\left(1 - \sqrt{R_a^- R_b^+}\, e^{-2\beta_1}\right)^2} \tag{6}$$

$$\xi_1 = \left(1 + \frac{4\sqrt{R_a^- R_b^+} \sin^2\!\left(\alpha_1 - \frac{\varphi_a^- + \varphi_b^+}{2}\right) e^{-2\beta_1}}{\left(1 - \sqrt{R_a^- R_b^+}\, e^{-2\beta_1}\right)^2}\right)^{-1} \tag{7}$$

$$\xi_2 = 1 - \frac{4\sqrt{R_b^+} \sin^2\!\left(\alpha_2 - \frac{\varphi_b^+}{2}\right) e^{-2\beta_2}}{\left(1 + \sqrt{R_b^+}\, e^{-2\beta_2}\right)^2} \tag{8}$$

Assuming that the intensity of light emitted from the emitting plane x in free space is $I(\lambda, x)$, which is mainly determined by the internal quantum efficiency of the EL structure, then the intensity of the light emitted from the emitting plane x inside the thin film layer structure can be expressed as:

$$I_e^+ = I(\lambda, x) T_e^+. \tag{9}$$

Normally, light emitted from different emitting planes located at different depths x, is incoherent. Thus, the normalized total amount of light $I_{total}$ from all emitting planes is the integral of $I_e$ over the depth $x_1$ and $x_2$, is given by:

$$I_{total} = \frac{1}{x_2 - x_1} \int_{x_1}^{x_2} I(\lambda, x) T_e^+ \, dx. \tag{10}$$

In OLEDs, light is emitted from the region where holes and electrons recombine. This region is within the light emitting layer and very close to the interface of the light emitting layer/hole transport layer [Tang et al. *J. Appl. Phys. Vol.* 65, 1989, p. 3610]. The total depth of the emitting region ($L = x_2 - x_1$) is rather small compared to the wavelength of the emitted light, thus $I_{total}$ is very close the $I_e$; and it is adequate to use equations (3) and (9) for OLED optical modeling, instead of equation (10), where x is the average of $x_1$ and $x_2$.

As shown in Equation (3), the transmittance $T_e$ of such an OLED structure is a function of the wavelength $\lambda$, the angle of incidence $\theta_{cavity}$, the reflectance $R_a^-$, transmittance $T_a^-$ and phase change on reflection $\phi_a^-$ of the top layer stack, the reflectance $R_b^+$ and phase change on reflection $\phi_b^+$ of the bottom layer stack, the refractive index n, extinction coefficient k and thickness d of the spacer layer, and the position x and the depth L of the emitting region. Although at first sight the equation resembles the transmittance of a Fabry-Perot filter, it is however substantially different. In particular, there is an extra term with the phase term $\xi_2$ in the numerator in Eq. (5). Like all Fabry-Perot cavities, the cavity effect is also present in the EL displays, which is determined by the factor of $\xi_1$. Because the emitting region in the EL display is much smaller compared to that of other Fabry-Perot cavities with much longer spacer layers, the EL display structure is also called a microcavity; similarly, the cavity effect is also called the microcavity effect. Like all Fabry-Perot cavity structures, here the cavity effect can either constructively enhance the transmittance $T_e$ of the emitting structure, for example, $T_e$ can be greater than unity under certain conditions; or destructively reduce $T_e$. For example, $T_e$ can be reduced to zero. The microcavity effect reaches its maximum condition when the phase factors $\xi_1$ and $\xi_2$ are both equal to unity in Eq. (5). If there is no absorption in the spacer layer, then $T_{emax}$ can be simplified as:

$$T_{emax}^+ = (1 - R_a^- - A_a^-) \frac{\left(1 + \sqrt{R_b^+}\right)^2}{\left(1 - \sqrt{R_a^- R_b^+}\right)^2}, \quad (11)$$

where $A_a^-$ is the absorptance of the top layer stack.

Figure 3A:
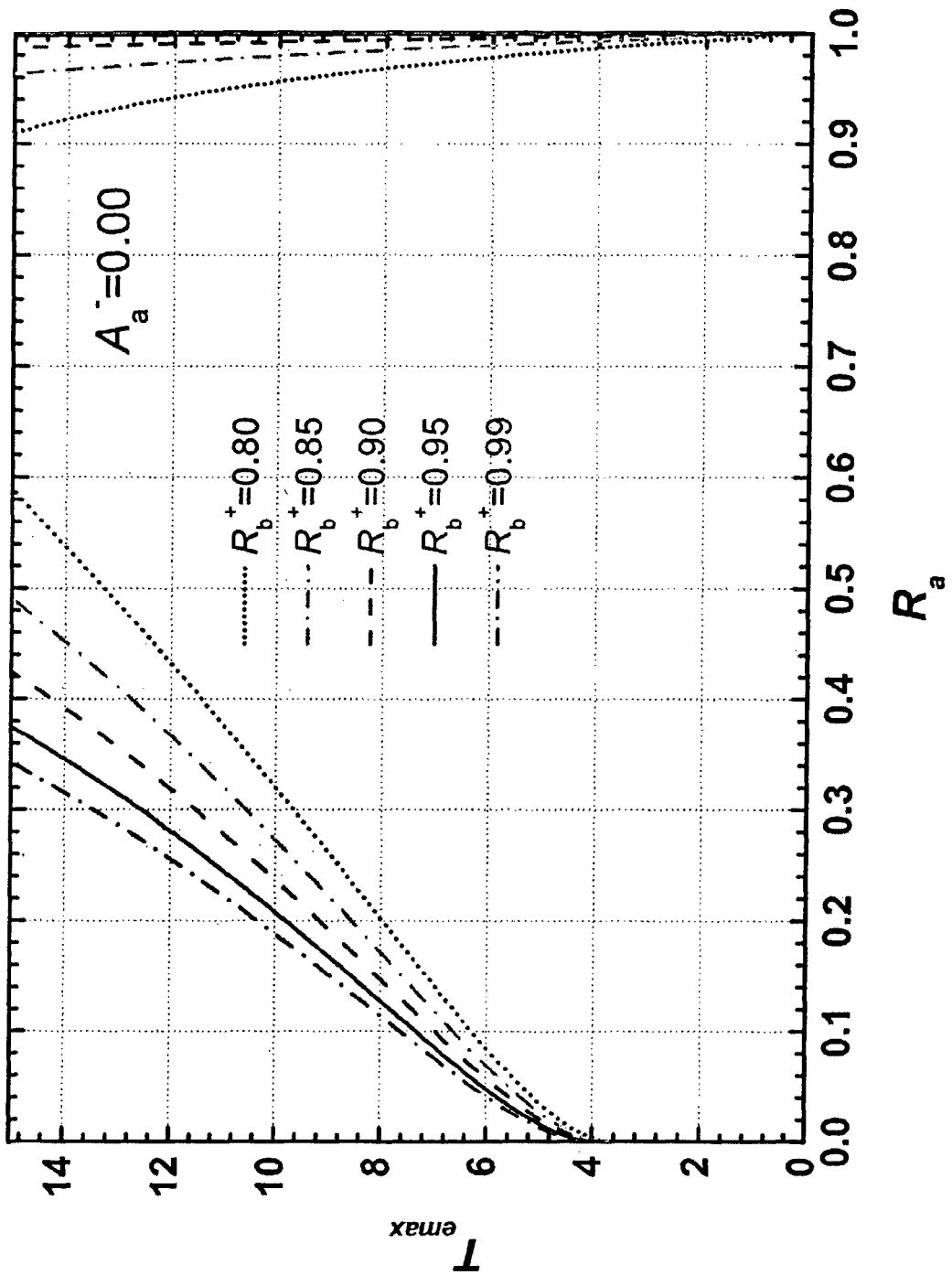
FIG. 3a shows the calculated $T_{emax}$ value as a function of $R_a^-$ for $A_a^-$=0.00 and for values of $R_b^+$ in the range of 0.80-0.99.

FIG. 3a shows the value of $T_{emax}$ as a function of $R_a^-$ for values of $R_b^+$ that lie between 0.80 and 0.99, assuming that $A_a^-=0$. These curves show that the maximum transmittance of a conventional OLED device is around 4 when the values of $R_b^+$ are between 0.80 and 0.99 and those of $R_a^-$ between 0.01 and 0.02. Usually, conventional OLED devices do not reach such values because their thin film structures are often not optimized for the optimum external extraction efficiency. FIG. 3a also shows that $T_{emax}$ can be increased if the value of $R_a^-$ is increased. For OLED devices which require wide angle emission, the reflectance $R_a^-$ is preferably less than 0.2. Higher $R_a^-$ reduces the bandwidth and the angular field of the OLED device. Some embodiments disclosed in this invention overcome the problem by controlling the phase changes on reflection.

Figure 3B:
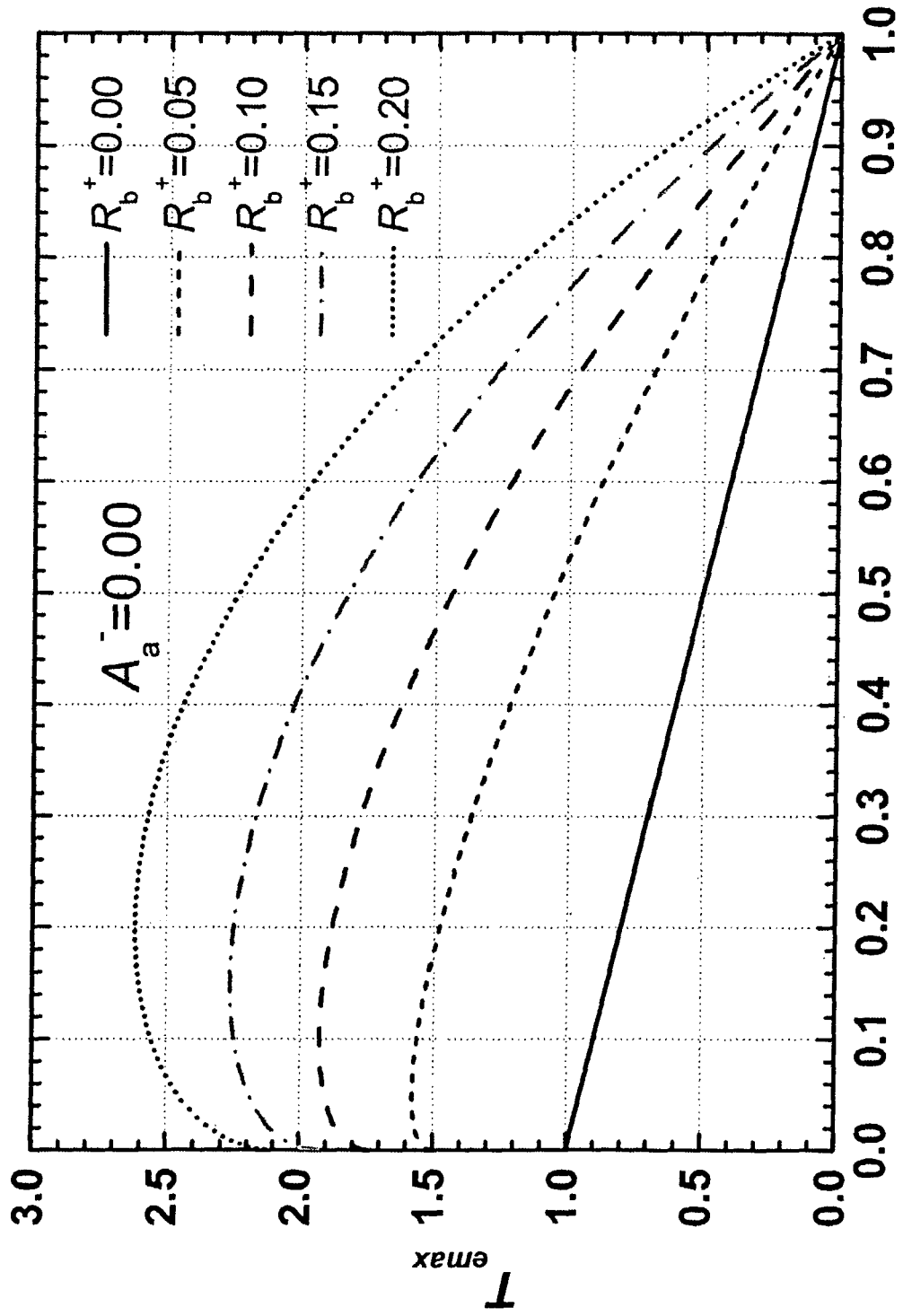
FIG. 3b shows the calculated $T_{emax}$ value as a function of $R_a^-$ for $A_a^-$=0.00 and for values of $R_b^+$ in the range of 0.00-0.25.

FIG. 3b shows the variation of $T_{emax}$ as a function of $R_a^-$ when the values of $R_b^+$ lie between 0.00 and 0.20, assuming that $A_a^-=0$. These curves show the maximum transmittance that an OLED device with a back black layer coating on the cathode side can achieve. The maximum value is between 1.0-2.5 when the values of $R_b^+$ are between 0.00 and 0.20 and those of $R_a^-$ between 0.01 and 0.05. Usually, conventional OLED devices with black layers such as those described in the above prior-art patents could not reach those values because their thin film structures are only optimized to reduce the reflectance of the cathode, not optimized for the optimum external extraction efficiency.

In order to enhance the contrast, the EL or OLED devices disclosed in prior art (for example, U.S. Pat. No. 6,411,019, U.S. Pat. No. 6,551,651, U.S. Pat. No. 6,429,451, and U.S. Pat. No. 6,608,333) have embodiments with black layers in front of the back electrodes in order to reduce the reflectance from its surface, which are usually based on aluminum or Mg:Ag. Thus, $R_b^+$ is small in these displays. Clearly, from the efficiency point of view, the performance of these devices with low $R_b^+$ is worse than that of devices without black layers, as demonstrated in FIGS. 3a and 4a. Lower $R_b^+$ results in a lower $T_{emax}$ and thus $T_e$. Real OLED devices would have even lower values of $T_e$ because the optimal conditions $\xi_1$ and $\xi_2$ equal to unity) are not satisfied in practice.

Figure 3C:
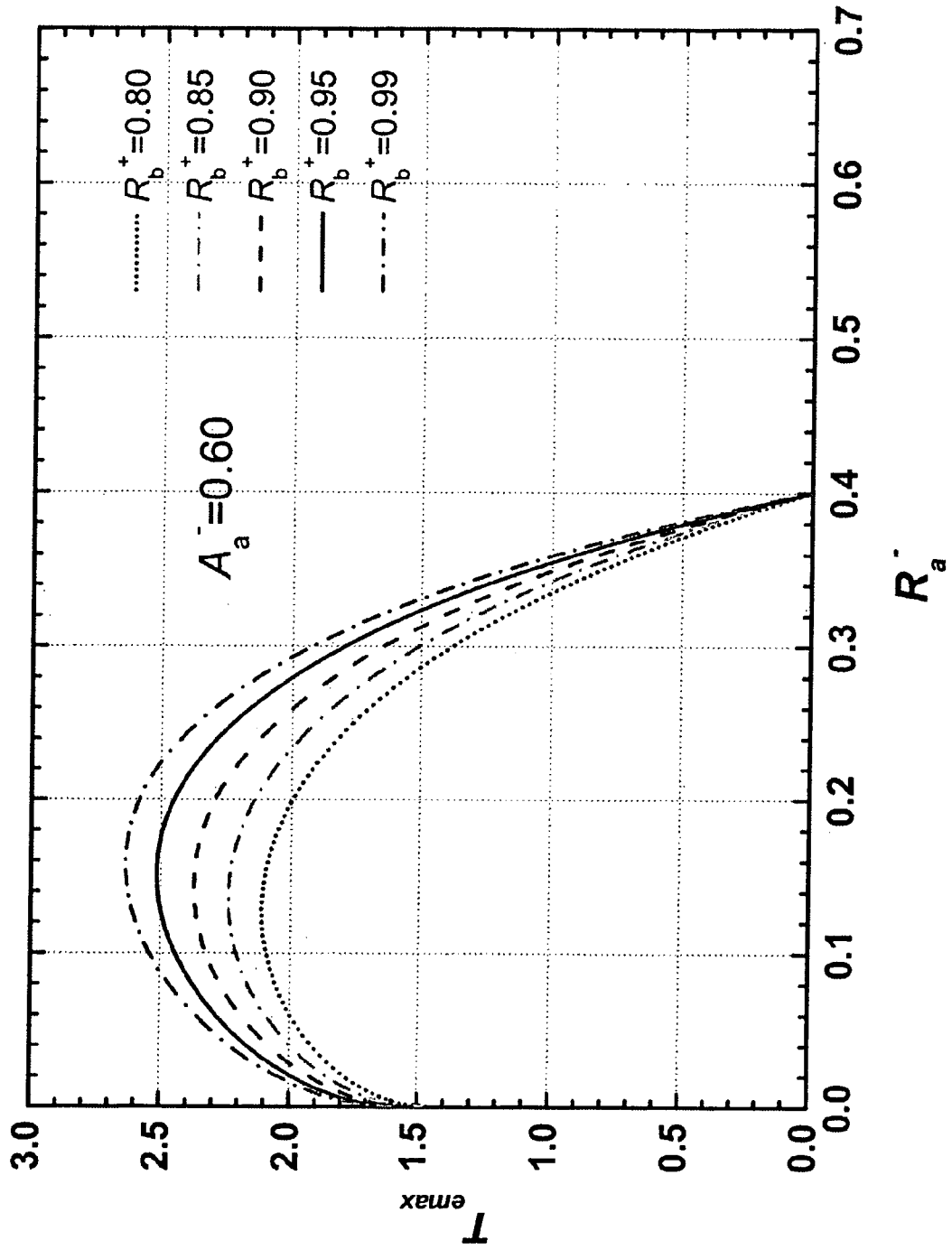
FIG. 3c shows the calculated $T_{emax}$ value as a function of $R_a^-$ for $A_a^-$=0.60 and for values of $R_b^+$ in the range of 0.80-0.95.

FIG. 3c shows the variation of $T_{emax}$ as a function of $R_a^-$ when the values of $R_b^+$ lie between 0.80 and 0.99, assuming that $A_a^-=0.6$. These curves show the maximum transmittances that an OLED device with a front black layer coating on the anode side can achieve. The maximum value is around 2 when the values of $R_b^+$ are between 0.80 and 0.90 and those of $R_a^-$ between 0.0 and 0.2. Again, conventional front black layer OLED devices such as those disclosed in the above prior-art patents could not reach those values because their thin film structures are only optimized to reduce the reflectance of the cathode, and are not optimized for the optimum external extraction efficiency.

Figure 4A:
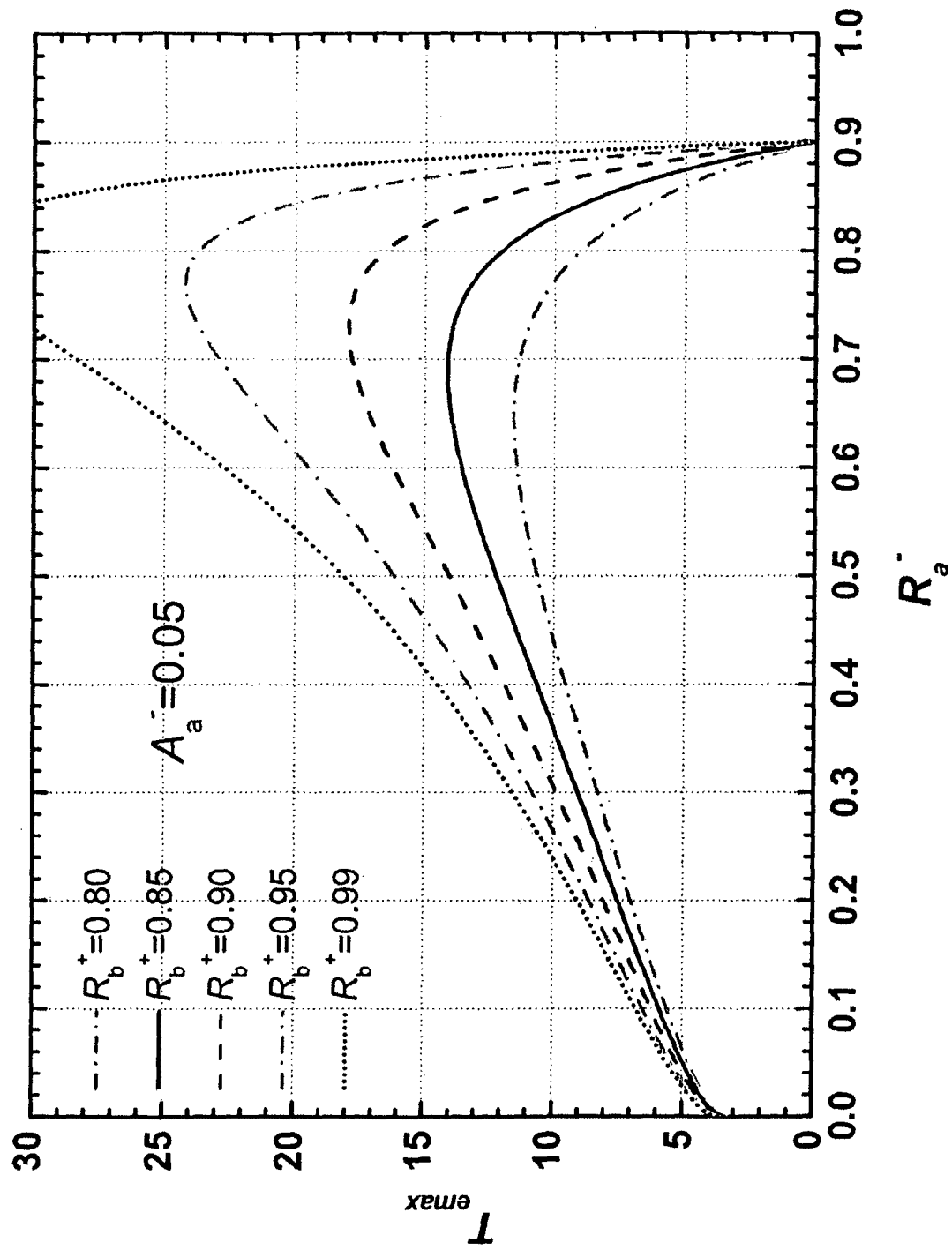
FIG. 4a shows the calculated $T_{emax}$ value as a function of $R_a^-$ for $A_a^-$=0.05 and for values of $R_b^+$ in the range of 0.80-0.99.
Figure 4B:
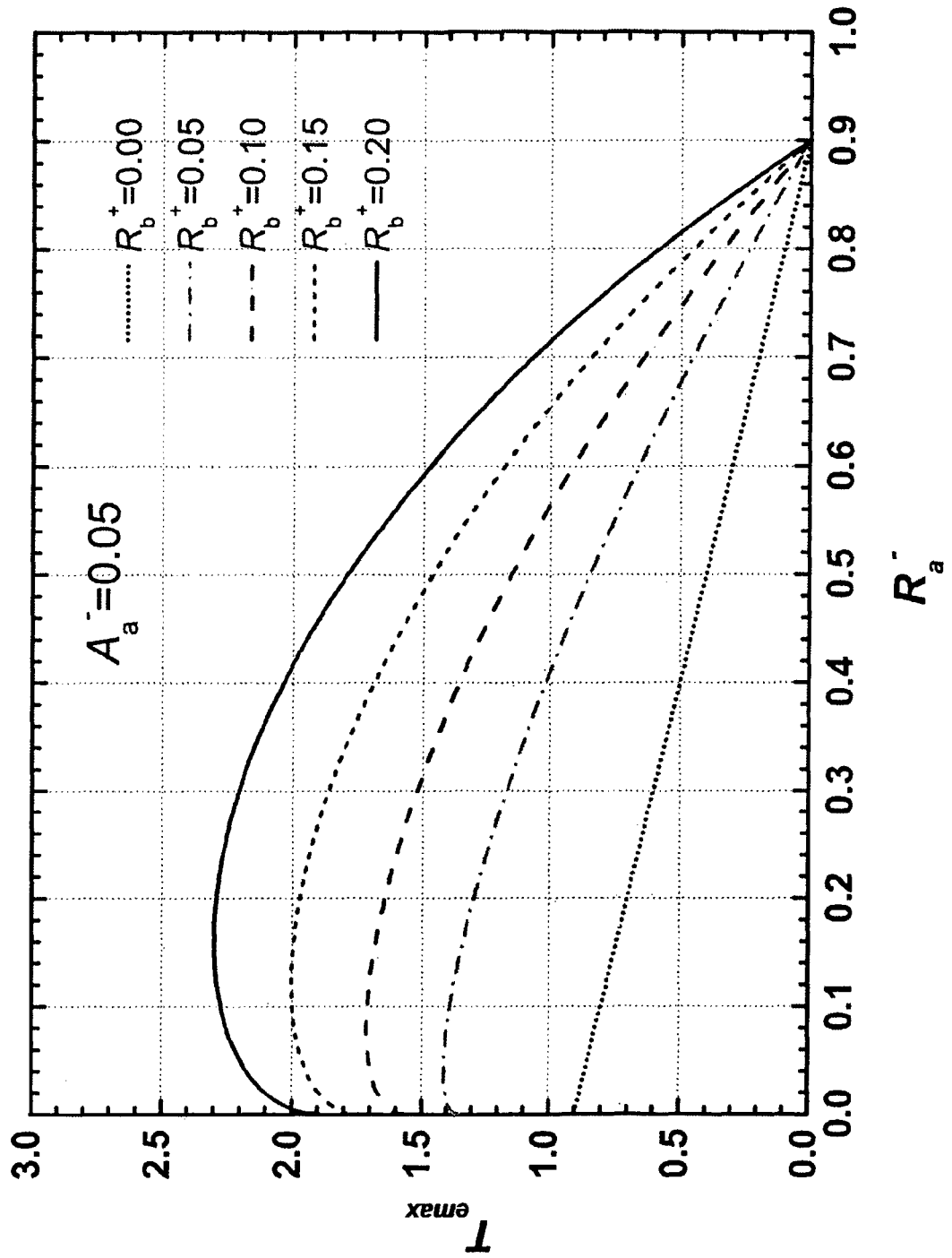
FIG. 4b shows the calculated $T_{emax}$ value as a function of $R_a^-$ for $A_a^-$=0.05 and for values of $R_b^+$ in the range of 0.00-0.25.

FIGS. 4a, 4b show results that are analogous to those displayed in FIGS. 3a and 3b, except that now a value of $A_a^-=0.05$ has been assumed. Clearly, absorption in the top multilayer structure is undesirable under normal circumstances because it reduces the maximum transmittance.

In the following sections, the transmittance of the emitting layer of an OLED device placed in free space is assumed to be unity, and thus the transmittance $T_e$ of a complete OLED thin film structure is the ratio to that of the free space value of the emitting layer alone. This value can be greater than unity.

In accordance with the principles of the present invention, the embodiments disclosed herein are designed to ensure that $\xi_1$ and $\xi_2$ are as close to unity as possible in order to achieve the maximum external light extraction efficiency. In addition, the thin film structures of the OLED devices with additional optional layer groups are also optimized to achieve high $T_{emax}$ or high contrast values.

Some materials used in OLEDs, such as cathode materials Al, Mg:Ag, or the hole transport buffer layer CuPc, polymer emitters, have a strong dispersion and their refractive indices n and the extinction coefficients k vary strongly with wavelengths. The results of calculations would be inaccurate if the optical constants defined at a single wavelength only were used. Thus, for all the embodiments disclosed here the optical constants of coatings used in the calculations were taken from the published literature as follows:

ITO: R. A. Synowicki, "Spectroscopic ellipsometry characterization of indium tin oxide film microstructure and optical constants", *Thin Solid Films*, Vol. 313, pp. 394-397 (1998);

Alq$_3$, CuPc, NPB: Wenfa Xie, Yi Zhao, Jingying Hou and Shiyong Liu, "Spectroscopic ellipsometry studies of CuPc and other materials for organic light-emitting devices", *Jpn. J. Appl. Phys.* Vol. 42, pp. 1466-1469 (2003);

Aluminum, silver: Handbook of Optical Constants of Solids, E. Palik, ed. (Academic Press, New York, 1991).

Without departure from the spirit of the invention, similar embodiments can be obtained also for the same coating materials with slightly different optical constants or completely different coating materials having different optical constants.

First Type of Embodiment

In accordance with the present invention, the first type of embodiments optimizes the layer thicknesses of a conventional OLED structure to obtain a high transmittance within the limits of the layer thicknesses. The first type of embodiments is comprised of a transparent glass substrate, a transparent anode layer such as ITO, a buffer layer for hole transport such as CuPc, a hole transport layer such as NPB, a electron transport layer such as Alq$_3$, an electron injection layer such as LiF and a cathode such as Al. The layer structures of the first type of embodiments are listed in Table 1 along with that of a conventional OLED.

Figure 5A:
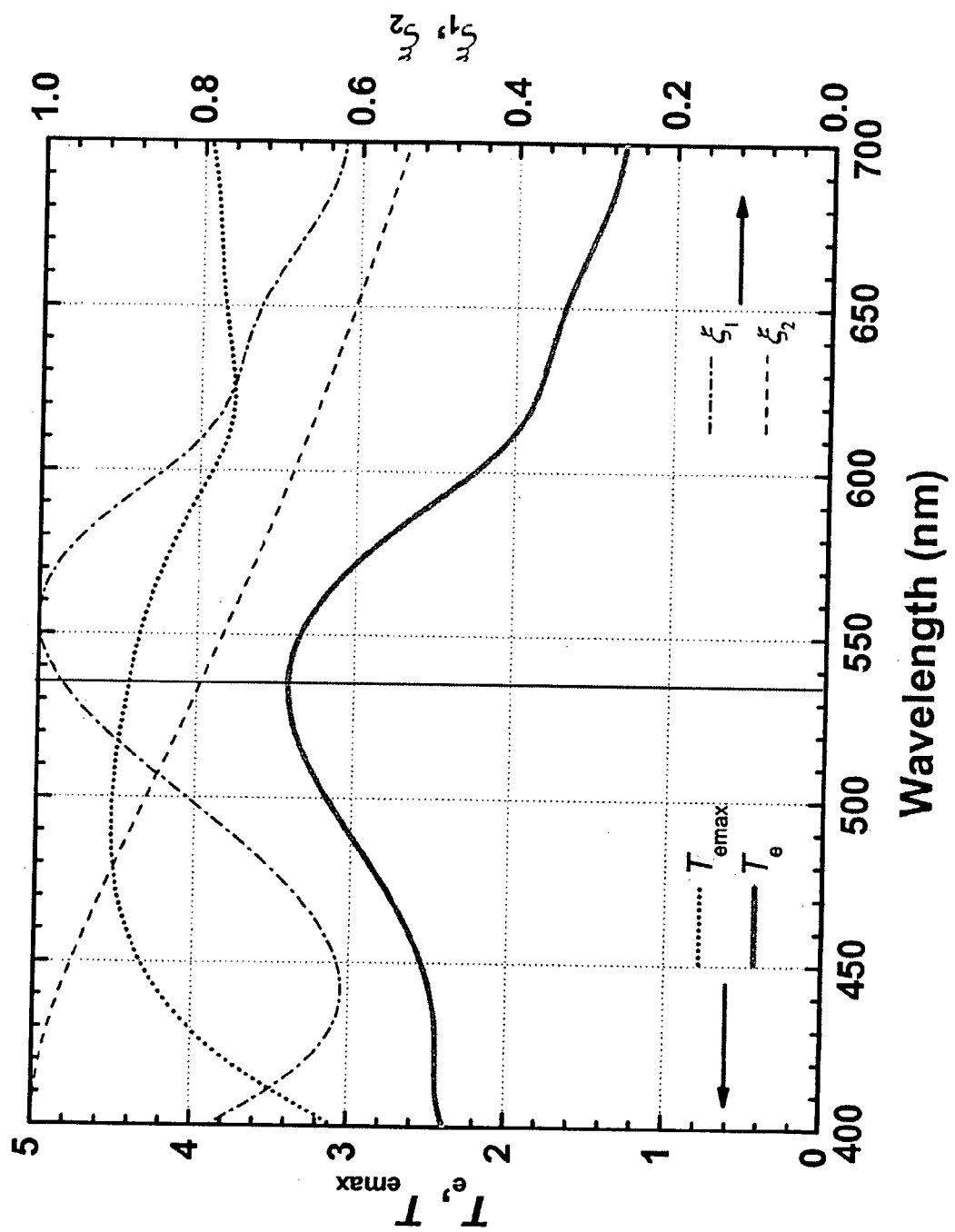
FIG. 5a shows the calculated $T_e$, $T_{emax}$, $\xi_1$ and $\xi_2$ values of a conventional OLED device for a normal viewing angle.
Figure 5B:
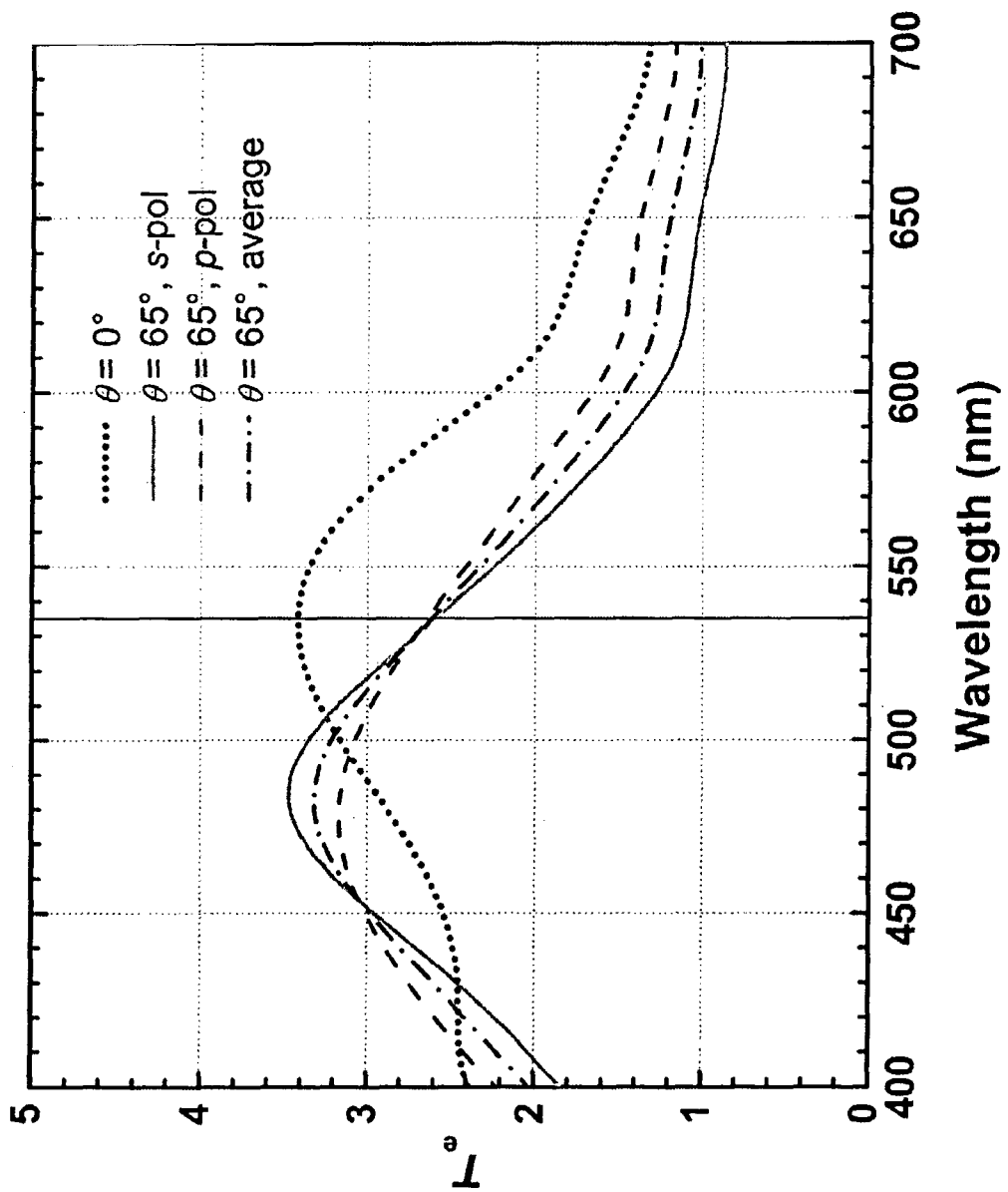
FIG. 5b shows the calculated $T_e$ values of a conventional OLED device at normal and 65° viewing angles for s- and p-polarized light, and for light with average polarization.

In the embodiment A1, the thicknesses have been optimized in accordance with the teachings of the present invention to have the following values:

Al (150 nm)/LiF (0.5 nm)/Alq$_3$ (73.7 nm)/NPB (45.23 nm)/CuPc (10.22 nm)/ITO (80.30 nm)/Glass. Embodiment A1 emits green light centred around 535 nm. FIG. 5a shows the calculated values of the transmittances $T_e$, $T_{emax}$, and of $\xi_1$ and $\xi_2$ of embodiment A1 at normal viewing angle in air. Clearly, both $\xi_1$ and $\xi_2$ reach their maximum values near the center emission wavelength 535 nm of Alq$_3$ at normal viewing angle. FIG. 5b shows that, in addition, the angular performance of embodiment A1 is also very good at 65° viewing angle in air for both s- and p-polarized light.

Figure 6A:
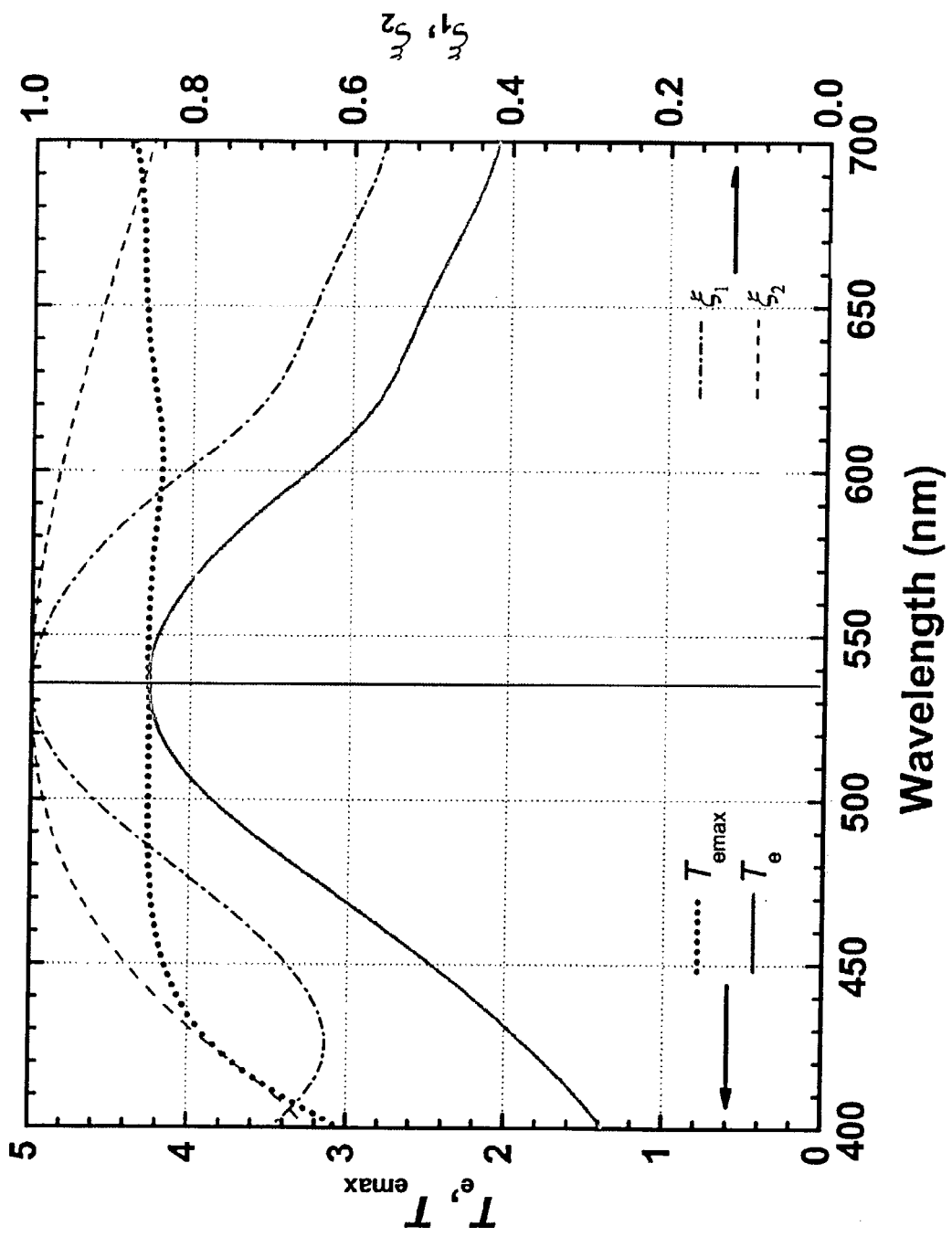
FIG. 6a shows the calculated $T_e$, $T_{emax}$, $\xi_1$ and $\xi_2$ values of the embodiment A1 in accordance with the present invention at normal viewing angle.
Figure 6B:
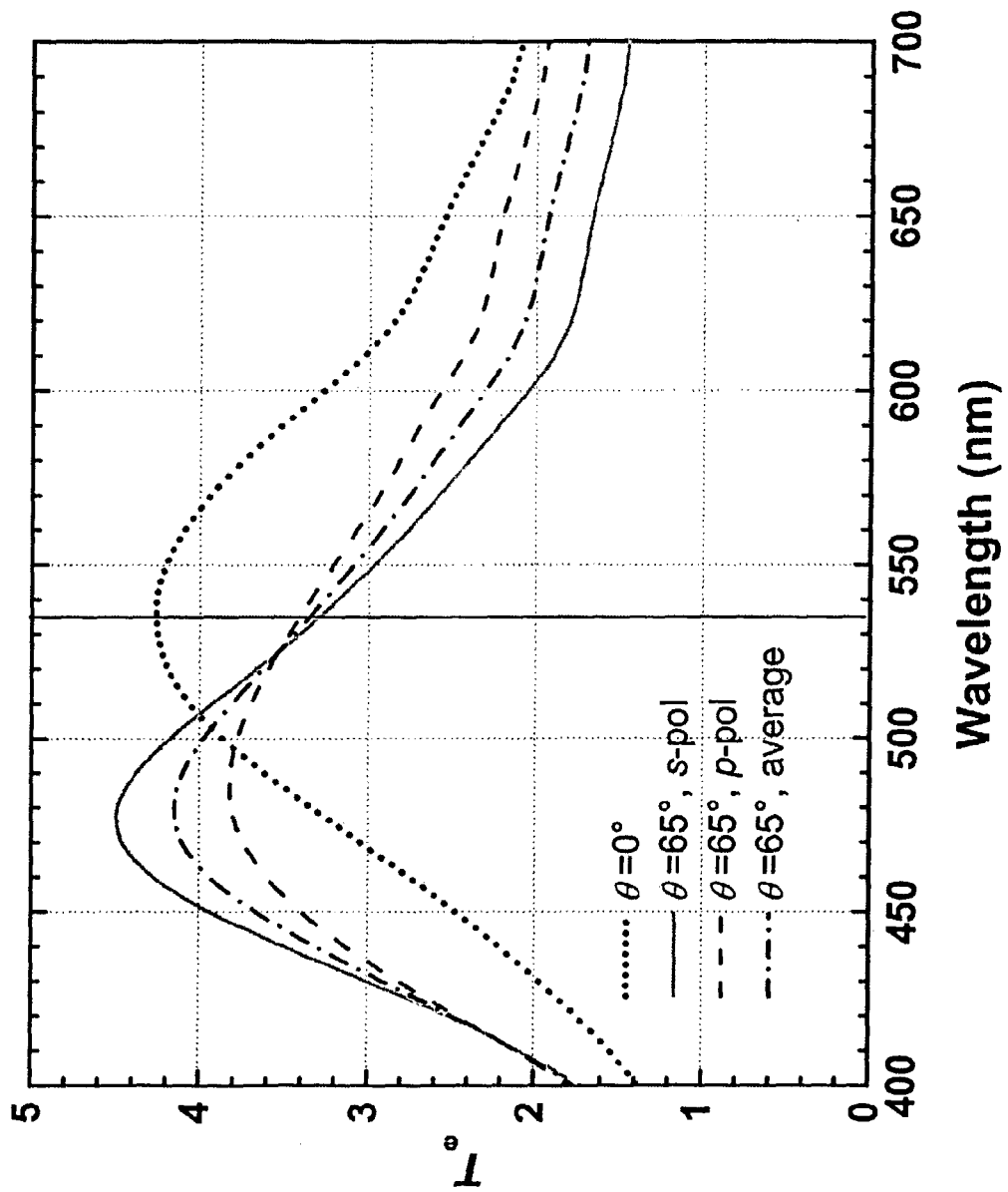
FIG. 6b shows the calculated $T_e$ values of the embodiment A1 in accordance with the present invention at normal and 65° viewing angles for s- and p-polarized light, and for light with average polarization.

For comparison purposes we describe the performance of a conventional OLED device with a typical layer structure and thicknesses:

Al (150 nm)/LiF (0.5 nm)/Alq$_3$ (50 nm)/NPB (50 nm)/CuPc (15 nm)/ITO (100 nm)/Glass. This is also shown in FIG. 6a for the normal viewing angle in air. Clearly, although the transmittance $T_e$ is centered at 535 nm, its value of 3.4 is smaller than the maximum transmittance of 4.4. Thus, this structure does not have the maximum extraction efficiency. FIG. 6b shows that the transmittance peaks shift to short wavelengths for both s- and p-polarized light as the viewing angle θ in air increases. This is generally true for all thin film based OLED devices.

From FIG. 5a, we can see that although the transmittance $T_e$ has a maximum value at the center wavelength of 535 nm, it falls at the blue and red wavelength regions. If such an OLED structure were used for a full color display, the efficiency at the blue and red regions would be low. To overcome the problem, in practical full color OLED devices the thicknesses of the cavity layers are optimized for each corresponding wavelength. These different cavity layers can be made of the same organic material with different color dopants or with completely different materials. One way to pattern the emitting layers is to deposit the layers through shallow masks. Alternatively, the thicknesses of the buffer or/and the HTL layer can be optimized to achieve similar high reflectance in the blue and red spectral regions.

Figure 7A:
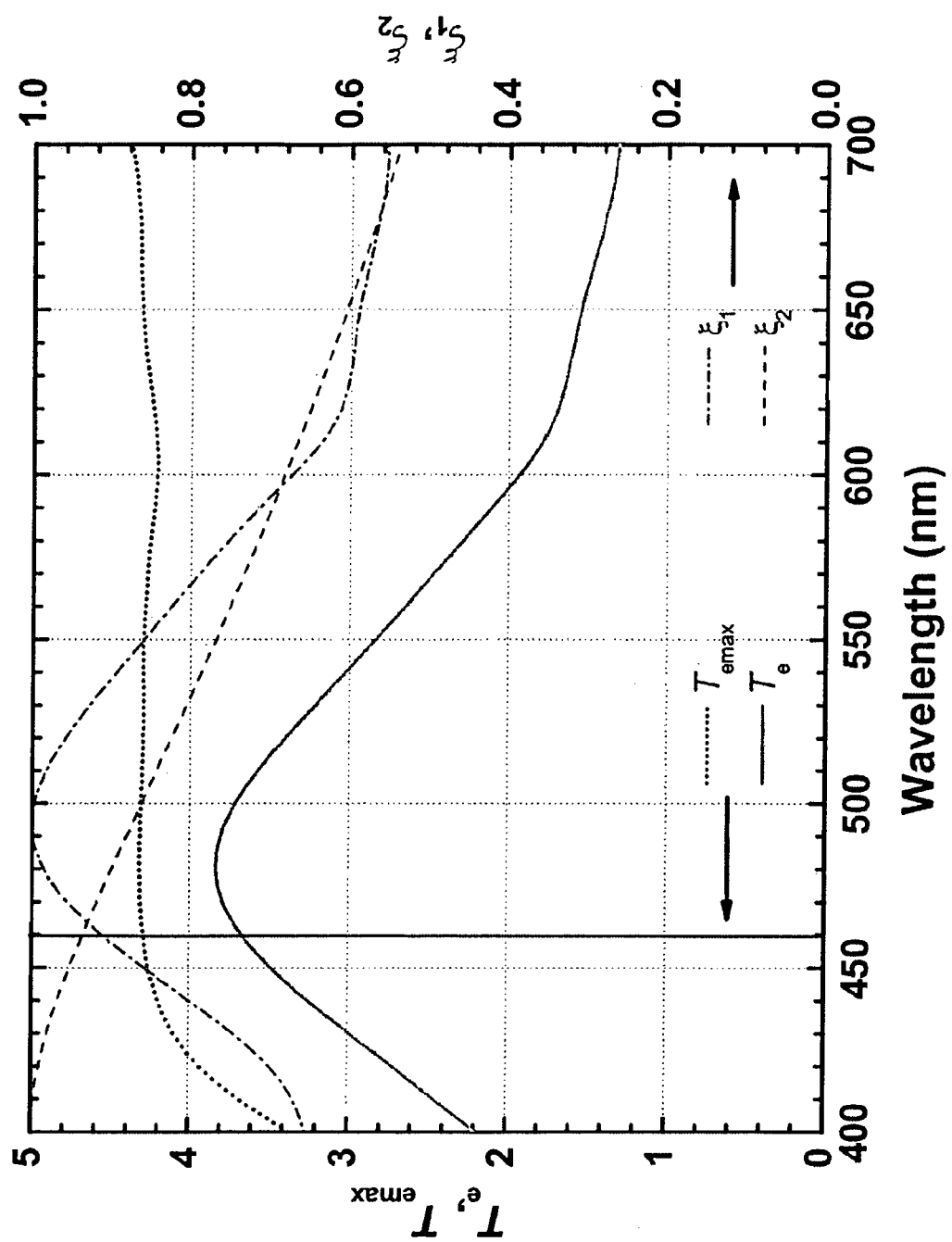
FIG. 7a shows the calculated $T_e$, $T_{emax}$, $\xi_1$ and $\xi_2$ of the embodiment A2 with additional dielectric layers in the top multilayer stack in accordance with the present invention at normal viewing angle.
Figure 7B:
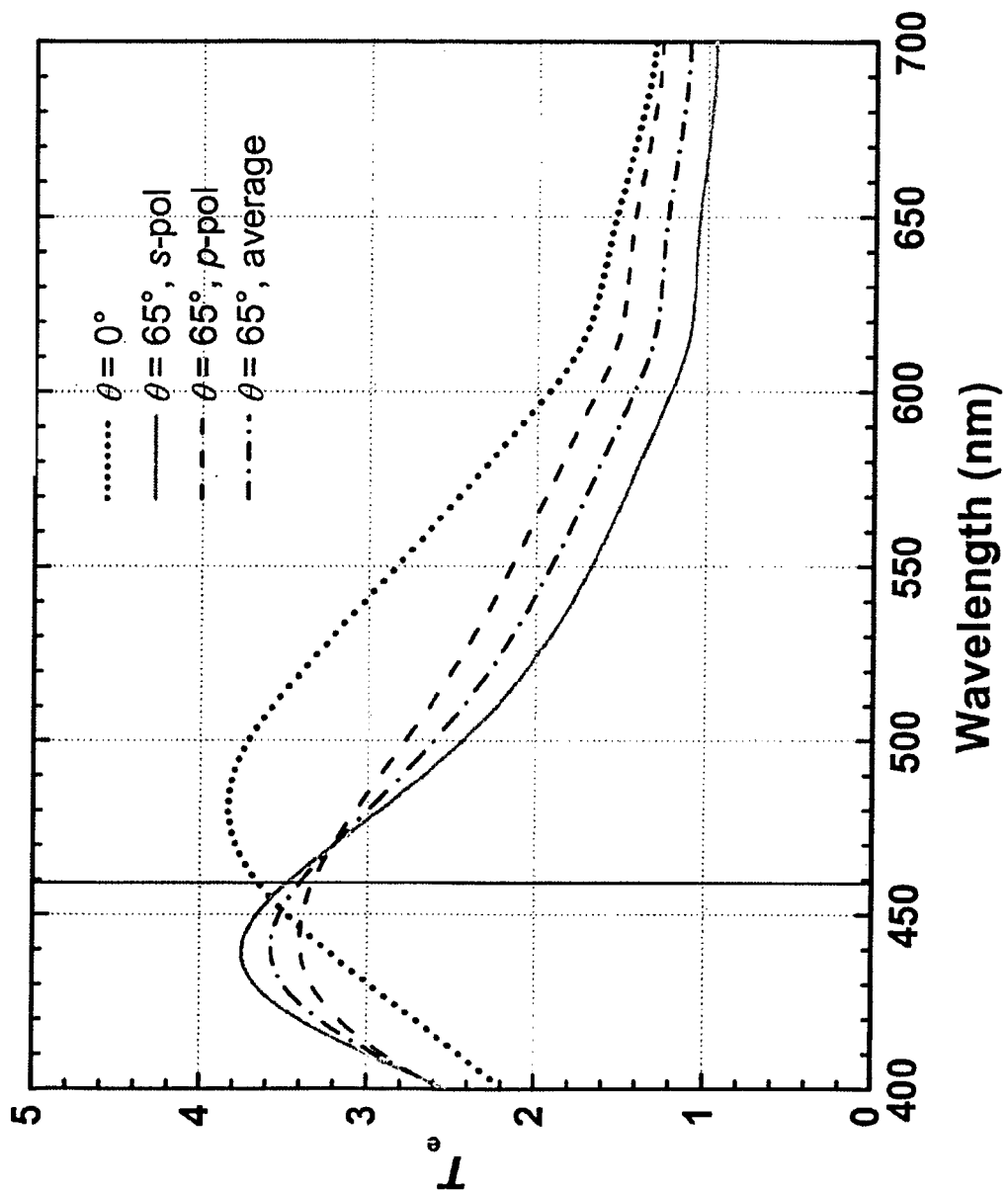
FIG. 7b shows the calculated $T_e$ values of the embodiment A2 with additional dielectric layers in the top multilayer stack in accordance with the present invention at normal and 65° viewing angles for s- and p-polarized light, and for light with average polarization.

Embodiment A2 in accordance with the present invention has a similar structure as embodiment A1, except that the emitting layer Alq$_3$ is doped with blue dye and thus emits blue light. In addition, the layer thickness of Alq$_3$ in embodiment A2 has been optimized in order to achieve high transmittance in the blue spectral region. FIG. 7a shows the calculated values of the transmittances $T_e$, $T_{emax}$, and of $\xi_1$ and $\xi_2$ of embodiment A2 at normal viewing angle. The angular performance at 0° and 65° viewing angles in air are shown in FIG. 7b.

Clearly, the transmittance of embodiment A2 in the blue region is much higher than that of embodiment A1 shown in FIG. 5a. In addition, the angular performance of A2 is also good. Because the cavity layer thickness is the only parameter for the optimization for the blue, green and red colors, it is difficult to achieve unity for both $\xi_1$ and $\xi_2$ in all three-wavelength regions. A compromise is made to balance the amount of light emitted at the different wavelengths.

Figure 8A:
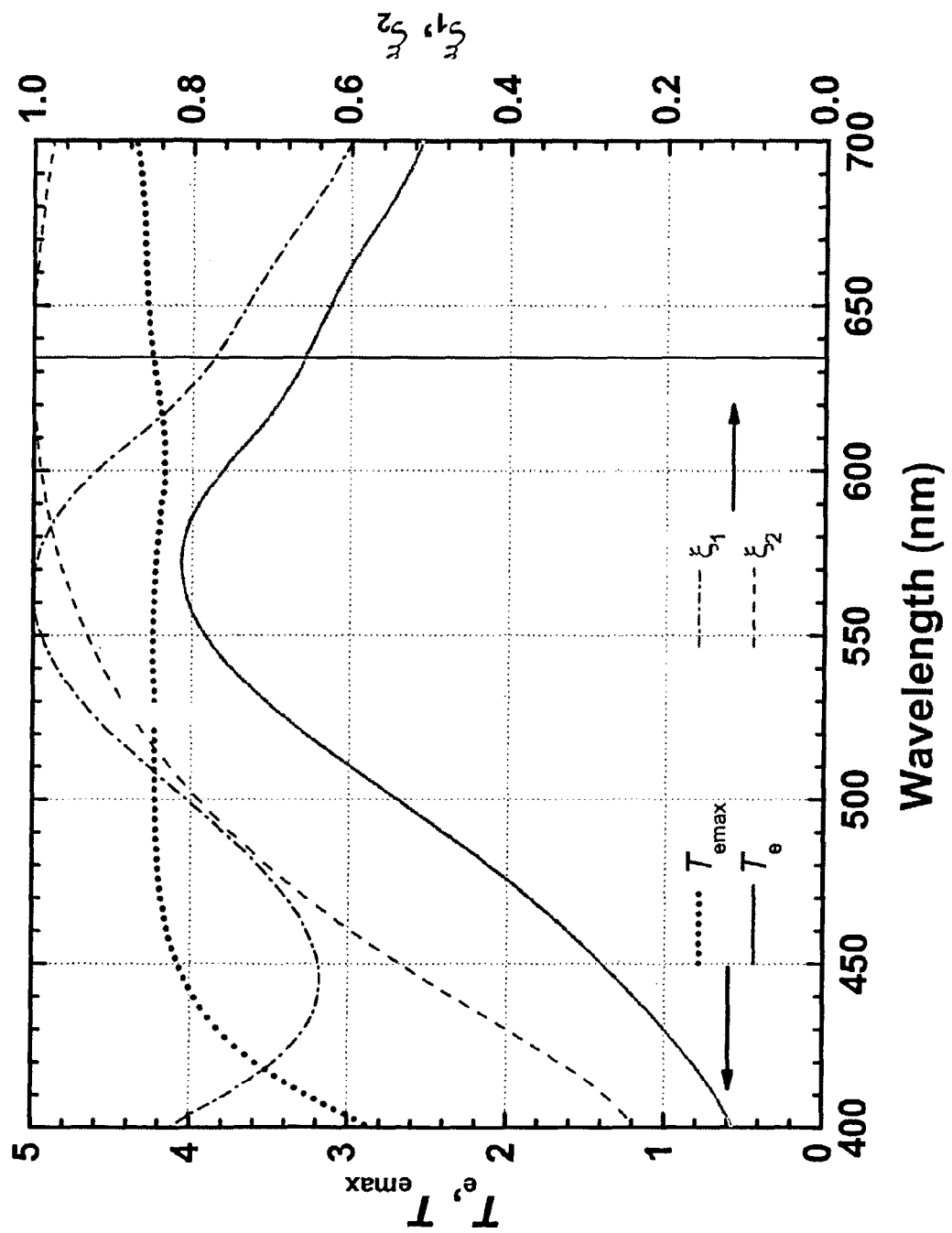
FIG. 8a shows the calculated $T_e$, $T_{emax}$, $\xi_1$ and $\xi_2$ values of the embodiment A3 with additional dielectric layers in the top mirror in accordance with the present invention at normal viewing angle.
Figure 8B:
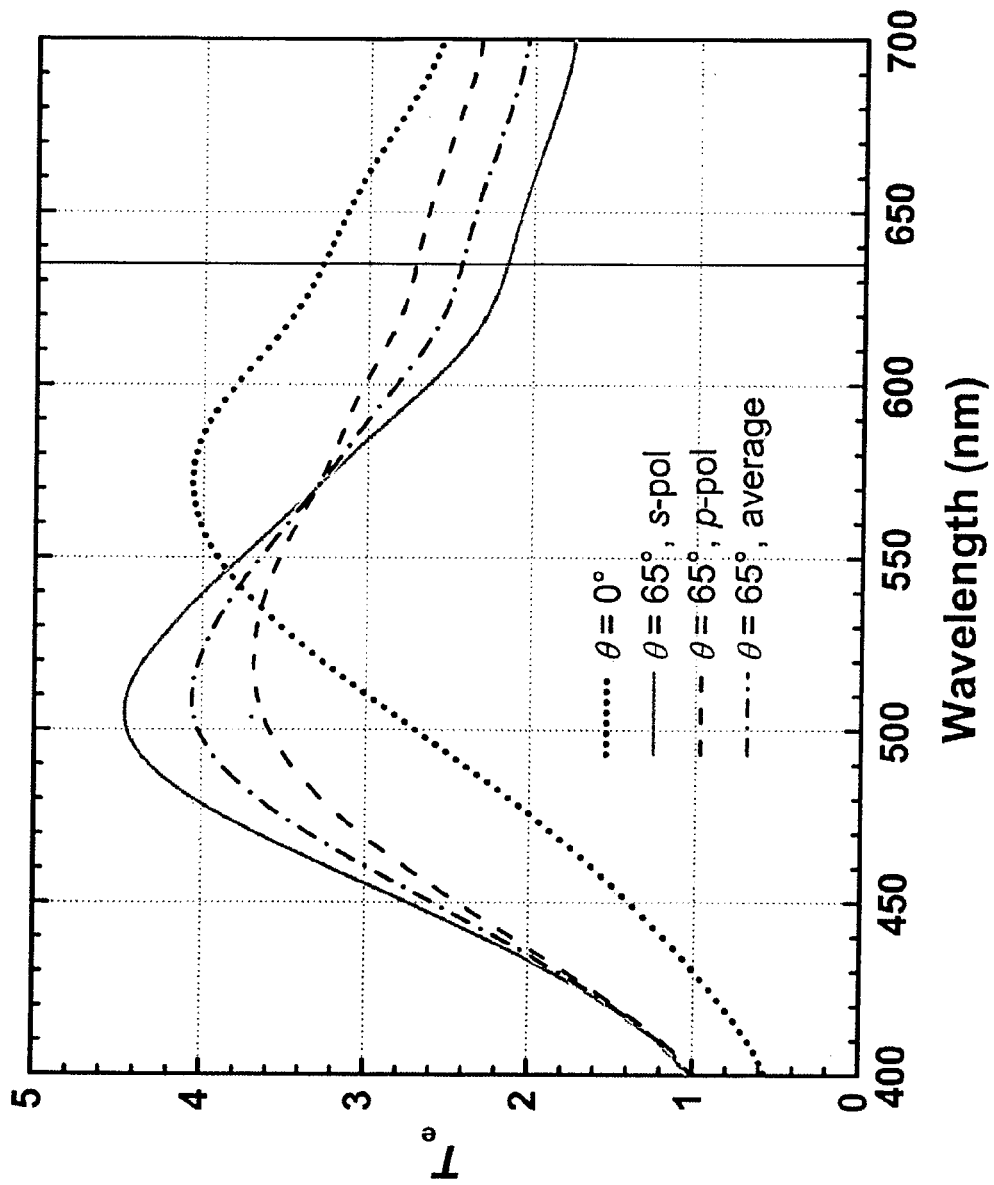
FIG. 8b shows the calculated $T_e$ values of the embodiment A3 with additional dielectric layers in the top multilayer stack in accordance with the present invention at normal and 65° viewing angles for s- and p-polarized light, and for light with average polarization.

Embodiment A3 in accordance with the present invention has a similar structure as embodiment A1, except that the emitting layer Alq$_3$ is doped with red dye and thus emits red light. In addition, the layer thickness of Alq$_3$ in embodiment A3 has been optimized in order to achieve high transmittance in the red spectral region. FIG. 8a shows the calculated values of the transmittances $T_e$, $T_{emax}$, and of $\xi_1$ and $\xi_2$ of embodiment A3 at the normal viewing angle. The performance at 0° and 65° viewing angles in air are shown in FIG. 8b.

Clearly, the transmittance in the red region is also much higher than that of A1 shown in FIG. 5a. In addition, the angular performance of A3 is also good. Once again, because the cavity layer thickness is the only parameter for the optimization for the blue, green and red colors, a compromise has to be made to balance the amount of light emitted at the different wavelengths.

Second Type of Embodiment

The aim of the second type of embodiments in accordance with the present invention is to obtain even higher efficiency and good angular field OLED devices by introducing additional thin film layers in the top multilayer stack. These added layers take advantages of the microcavity enhancement effect and at the same time minimize the problems associated with the conventional cavity effects such as the reduction of angular fields and of the bandwidth narrowing. The second type of embodiments is comprised of a transparent glass substrate, a top multilayer stack comprising a transparent anode layer such as ITO, a functional layer group made of dielectric or metal layers either before and after the ITO layer, a buffer layer for hole transport such as CuPc, a hole transport layer such as NPB, an electron transport layer such as Alq$_3$, an electron injection layer such as LiF and a cathode such as Al. The layer structures of the second type of embodiments are listed in Table 2.

Figure 9A:
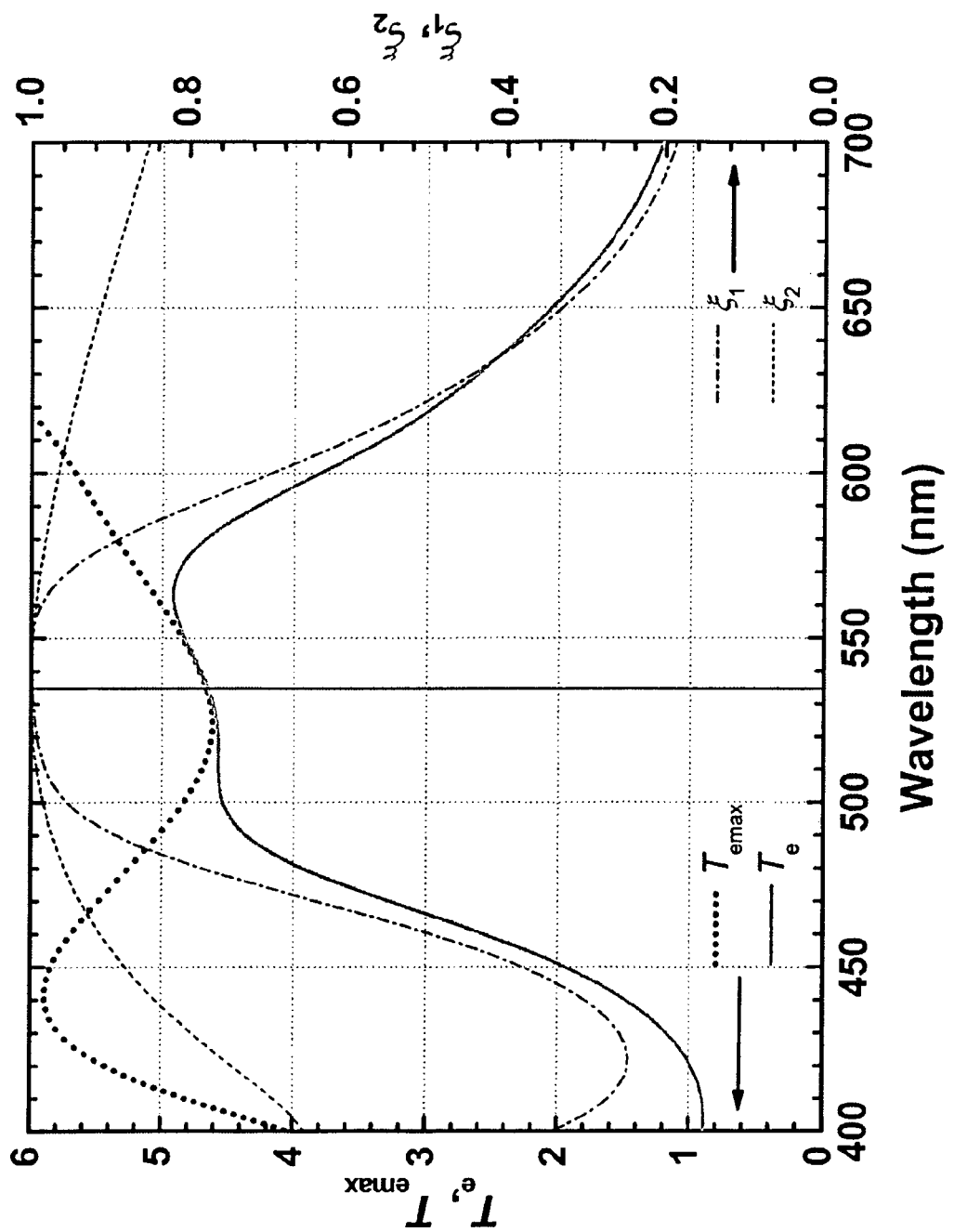
FIG. 9a shows the calculated $T_e$, $T_{emax}$, $\xi_1$ and $\xi_2$ values of the embodiment B1 with an additional silver layer in the top multilayer stack in accordance with the present invention at normal viewing angle.
Figure 9B:
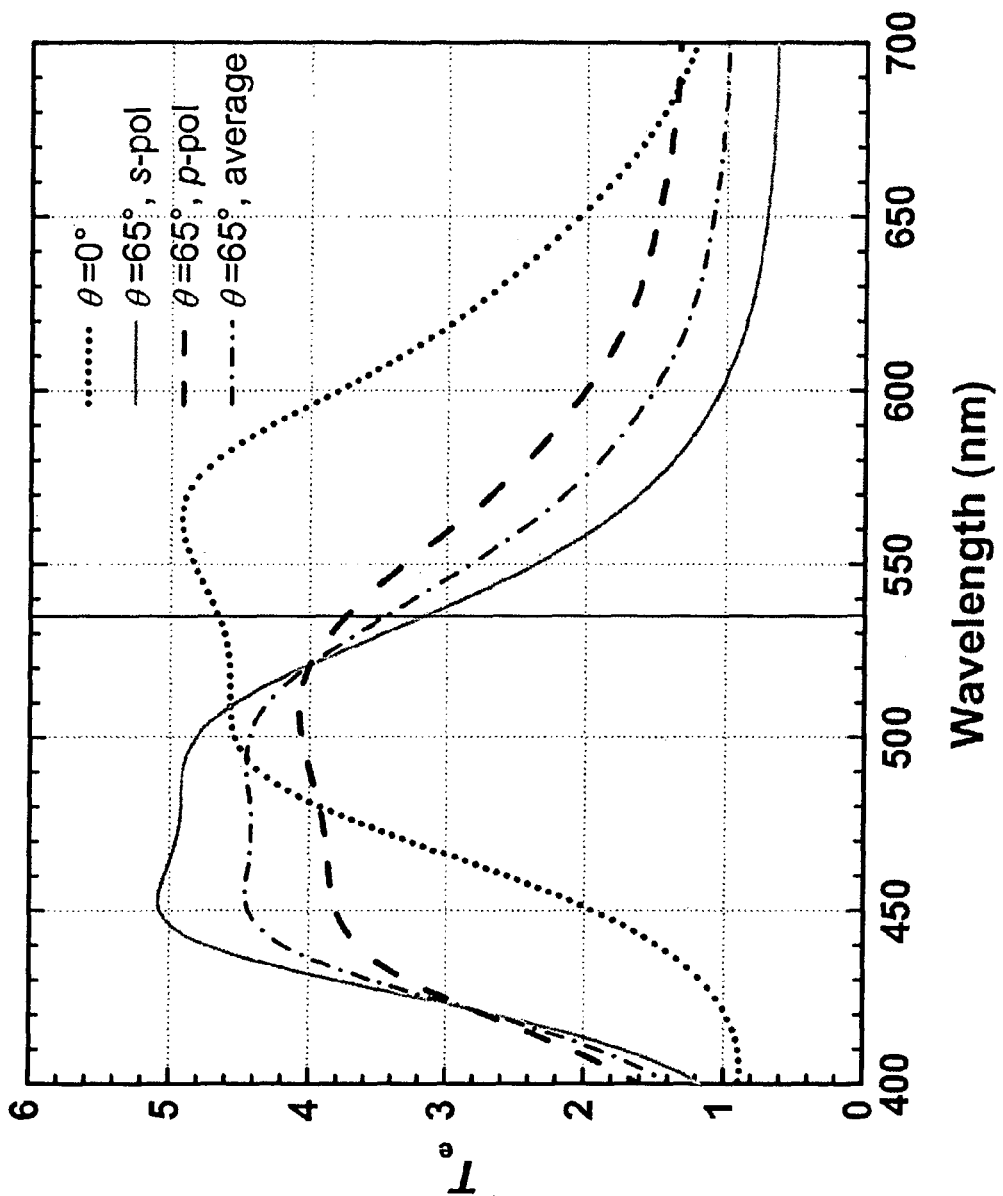
FIG. 9b shows the calculated $T_e$ values of the embodiment B1 with an additional silver layer in the top multilayer stack in accordance with the present invention at normal and 65° viewing angles for s- and p-polarized light, and for light with average polarization.

In embodiment B1 in accordance with the present invention, the layer structure and layer thicknesses are chosen according to the teachings of the present invention. Embodiment B1 emits green light. FIG. 9a shows the calculated values of the transmittances $T_e$, $T_{emax}$, and of $\xi_1$ and $\xi_2$ of embodiment B1 at a normal viewing angle. The angular performance is given in FIG. 9b. In embodiment B1, two additional dielectric layers are deposited onto the glass substrate before the ITO layer in order to increase the internal reflectance of the top mirror and thus to increase the emission of the structure. Both the internal reflectance and the phase change on internal reflection of the top mirror have been optimized to obtain maximum $\xi_1$ and $\xi_2$ values for a relatively broader spectral region including the center wavelength 535 nm. Compared to embodiment A1, B1 has not only a higher transmittance but also a wider angular field.

Similarly, a full-color OLED device can be formed by using red, green and blue emitters. The blue and red OLEDs with the similar layer structures but different cavity layers or top multilayer stacks can be obtained.

Figure 10A:
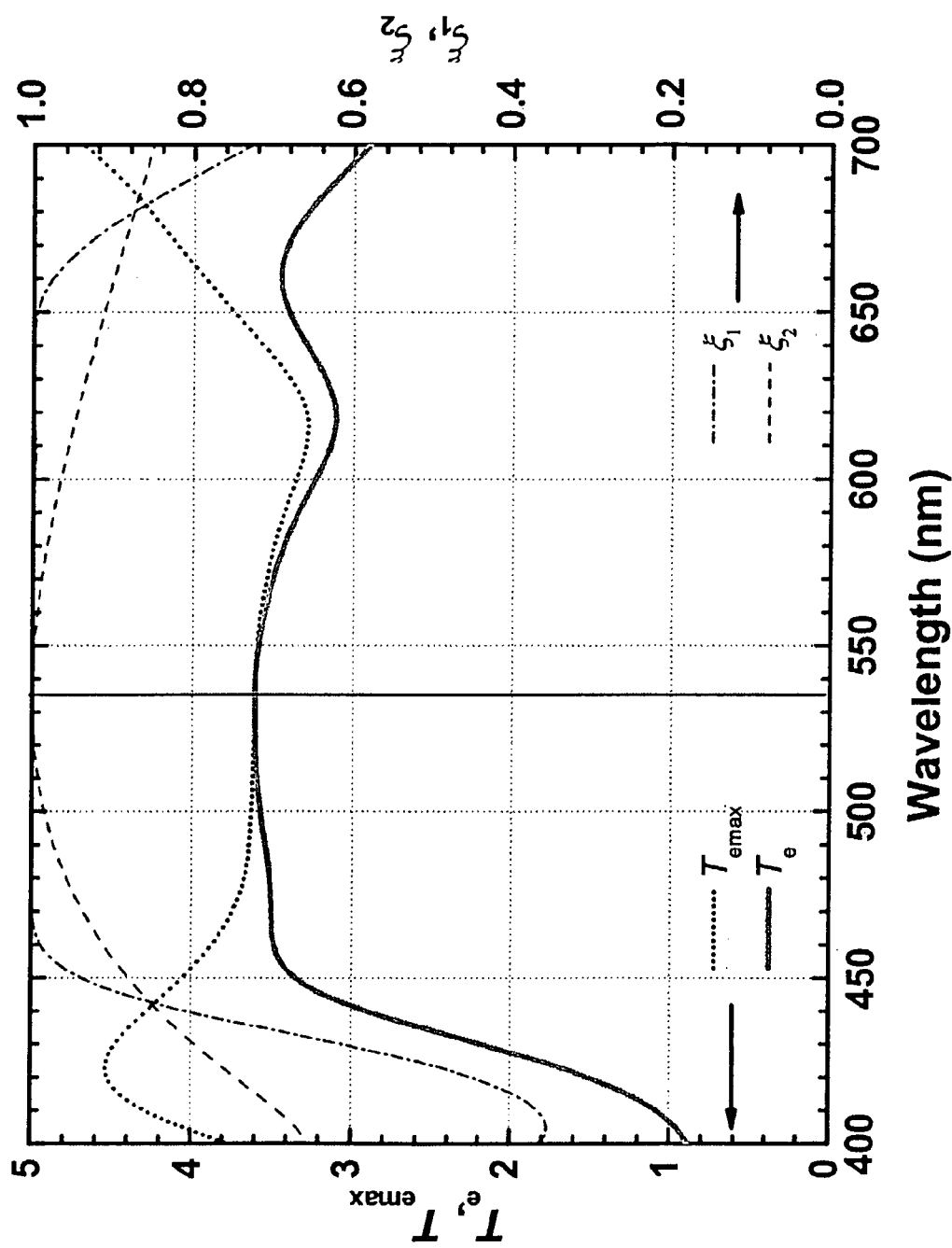
FIG. 10a shows the calculated $T_e$, $T_{emax}$, $\xi_1$ and $\xi_2$ values of the embodiment B2 in accordance with the present invention at normal viewing angle.
Figure 10B:
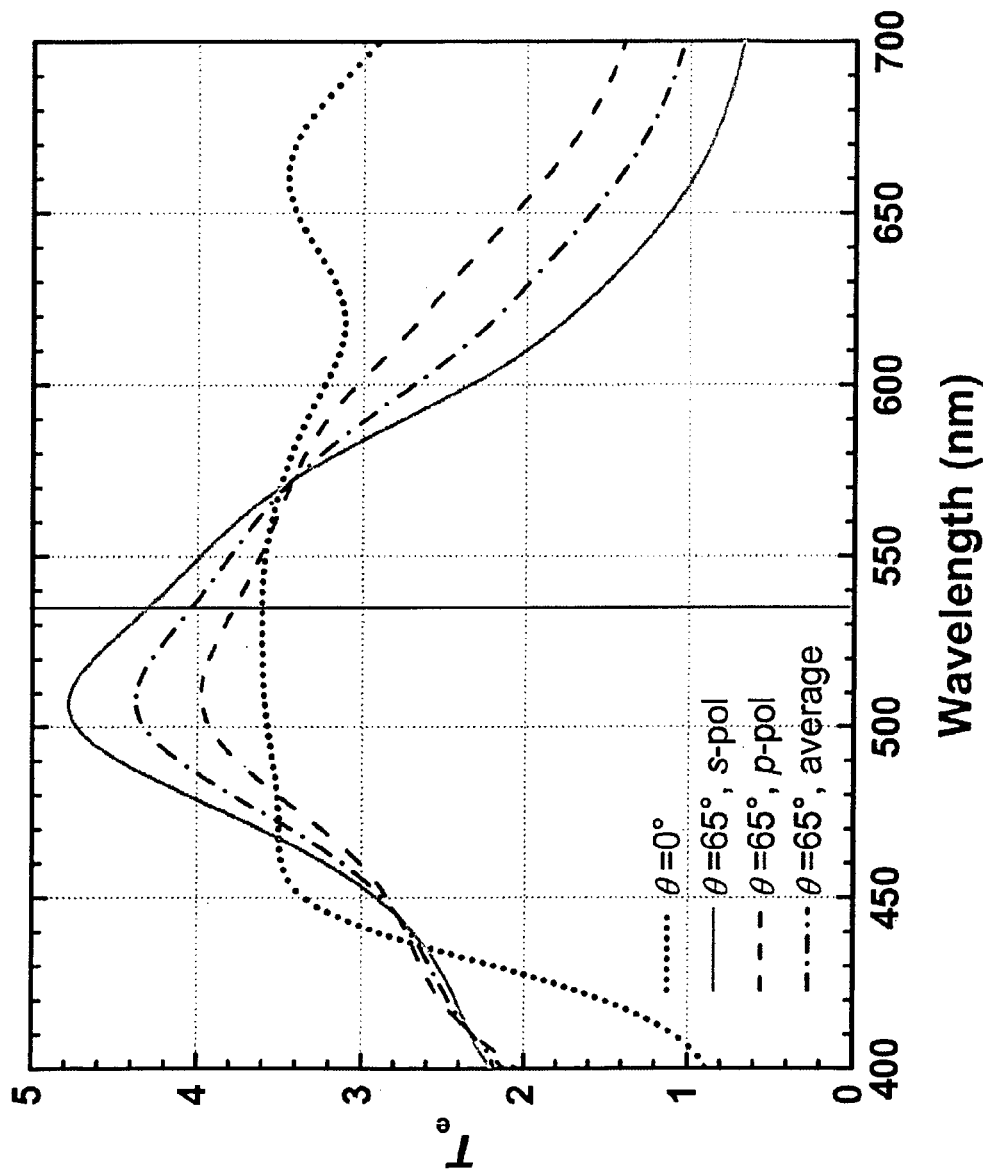
FIG. 10b shows the calculated $T_e$ values of the embodiment B2 with an additional silver layer in the top multilayer stack in accordance with the present invention at normal and 65° viewing angles for s- and p-polarized light, and for light with average polarization.

Another embodiment B2 in accordance with the present invention is similar to embodiment B1. Instead of adding 1 pair of SiO$_2$/TiO$_2$ layers to the multilayer stack, B2 adds 3 pairs of SiO$_2$/TiO$_2$. The layer thicknesses and internal reflectance and as well as phase change on internal reflection have been optimized in accordance to the teachings of the present invention. FIG. 10a shows the calculated values of the transmittances $T_e$, $T_{emax}$, and of $\xi_1$ and $\xi_2$ of embodiment B1 at a normal viewing angle. The angular performance for 0° and 65° viewing angles in air are shown in FIG. 10b. The layer structure and layer thicknesses are listed in Table 2. Clearly, embodiment B2 has much broader wavelength bandwidth than the conventional OLED as well as the first type of embodiments A1-A3. Because it has a high extraction efficiency across the whole visible spectrum, it could be used for white light OLEDs.

In another embodiment B3 in accordance with the present invention, the top multilayer stack comprises of an ITO layer, a metal layer and CuPc and NPB. The layer structure and thicknesses of B3 have been optimized to achieve a very high transmittance as well as a good angular performance. Here the position, thickness and material of the metal layer are critical. Any layer added here should have a small absorption, be conducting and at the same time have relatively flat phase change on reflection. Silver is chosen here because it has a much smaller absorption than any other metal in the visible part of the spectrum and it also has a high reflectance. Preferably, the thickness of the silver film should be between 8-25 nm. Embodiment B3 emits green light. The layer structure and layer thicknesses of embodiment B3 are listed in Table 2.

Figure 11A:
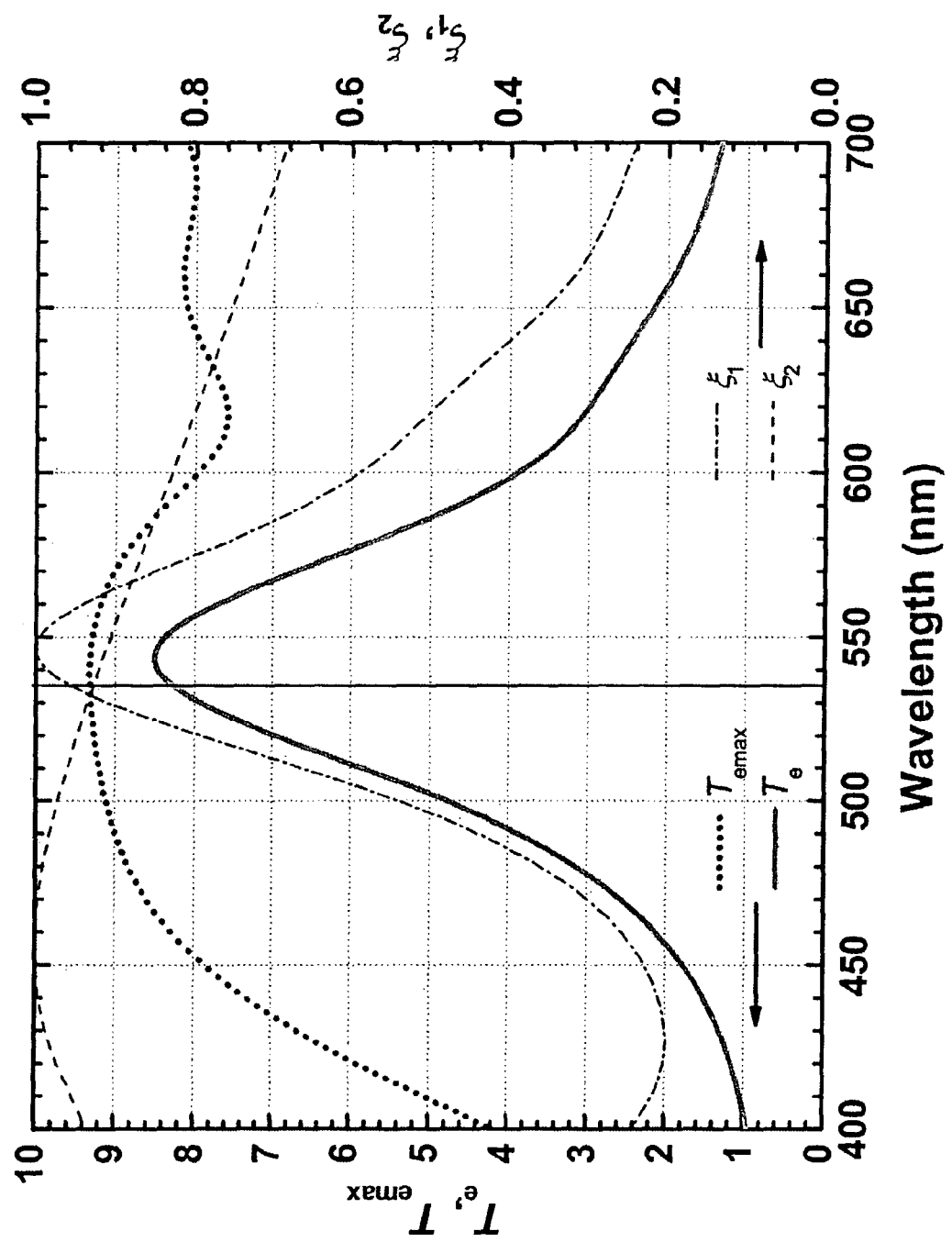
FIG. 11a shows the calculated $T_e$, $T_{emax}$, $\xi_1$ and $\xi_2$ values of the embodiment B3 in accordance with the present invention at normal viewing angle.
Figure 11B:
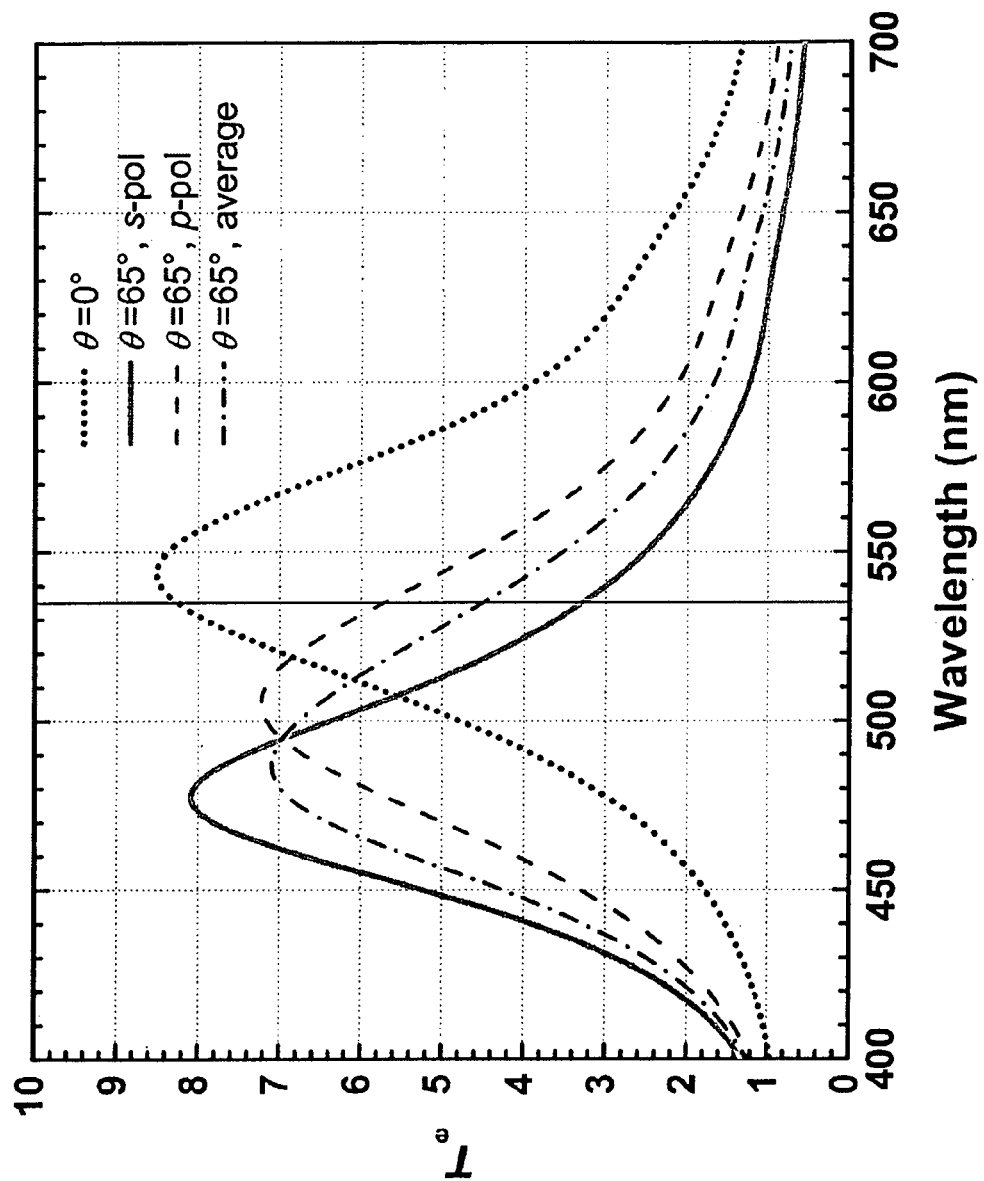
FIG. 11b shows the calculated $T_e$ values of the embodiment B3 in accordance with the present invention at normal and 65° viewing angles for s- and p-polarized light, and for light with average polarization.

FIG. 11a shows the calculated values of the transmittances $T_e$, $T_{emax}$, and of $\xi_1$ and $\xi_2$ of embodiment B3 at normal viewing angle. FIG. 11b shows the performance for 0° and 65° viewing angles in air. Clearly, both $\xi_1$ and $\xi_2$ have maximum values close to the maximum transmittance at the center wavelength 535 nm at the normal viewing angle. Such a device has a transmittance that is twice as high as that of a conventional OLED shown in FIG. 6a. In addition, the angular performance of the device is also good even at 65° viewing angle in air (FIG. 11b).

Figure 12A:
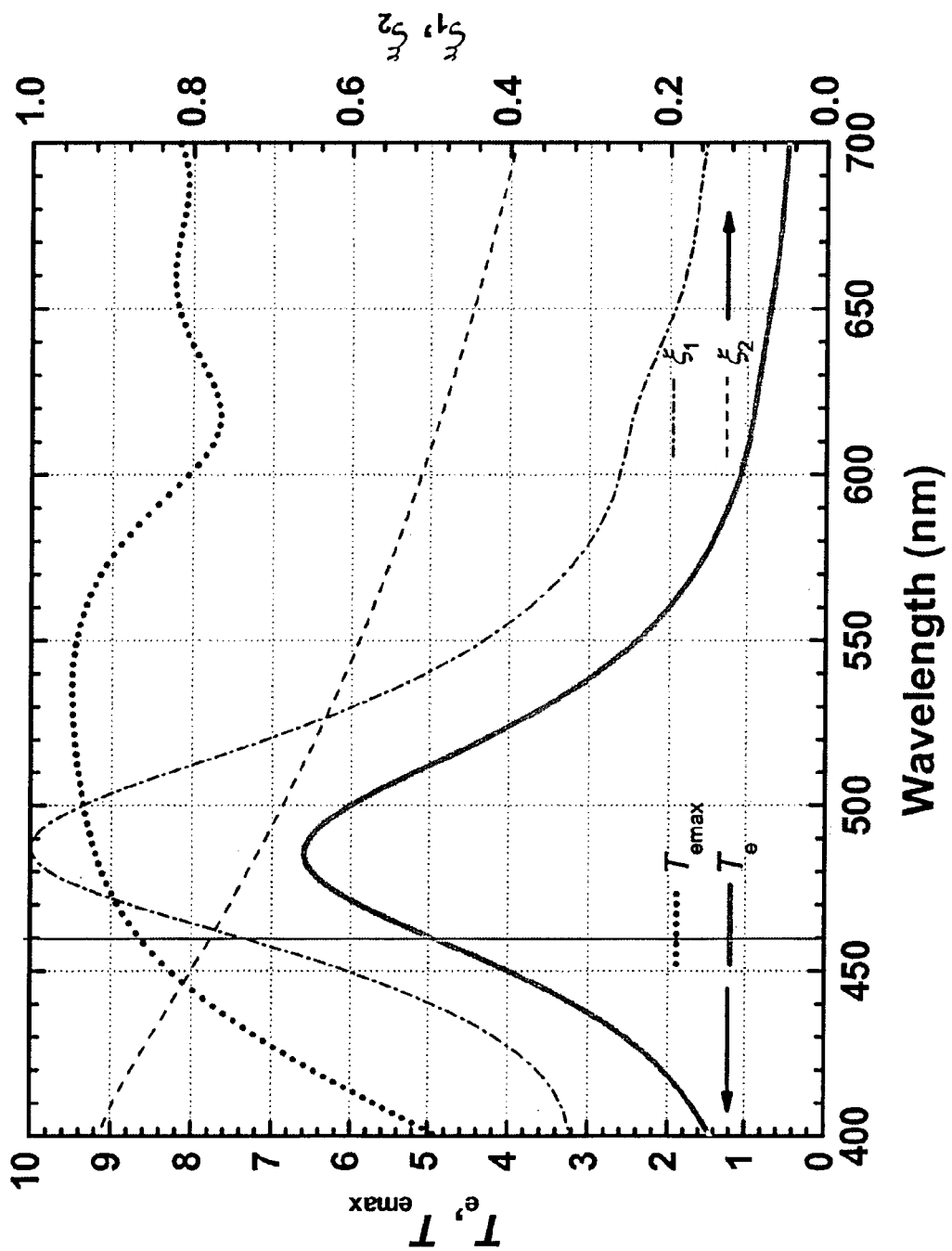
FIG. 12a shows the calculated $T_e$, $T_{emax}$, $\xi_1$ and $\xi_2$ values of the embodiment B4 in accordance with the present invention at normal viewing angle.
Figure 12B:
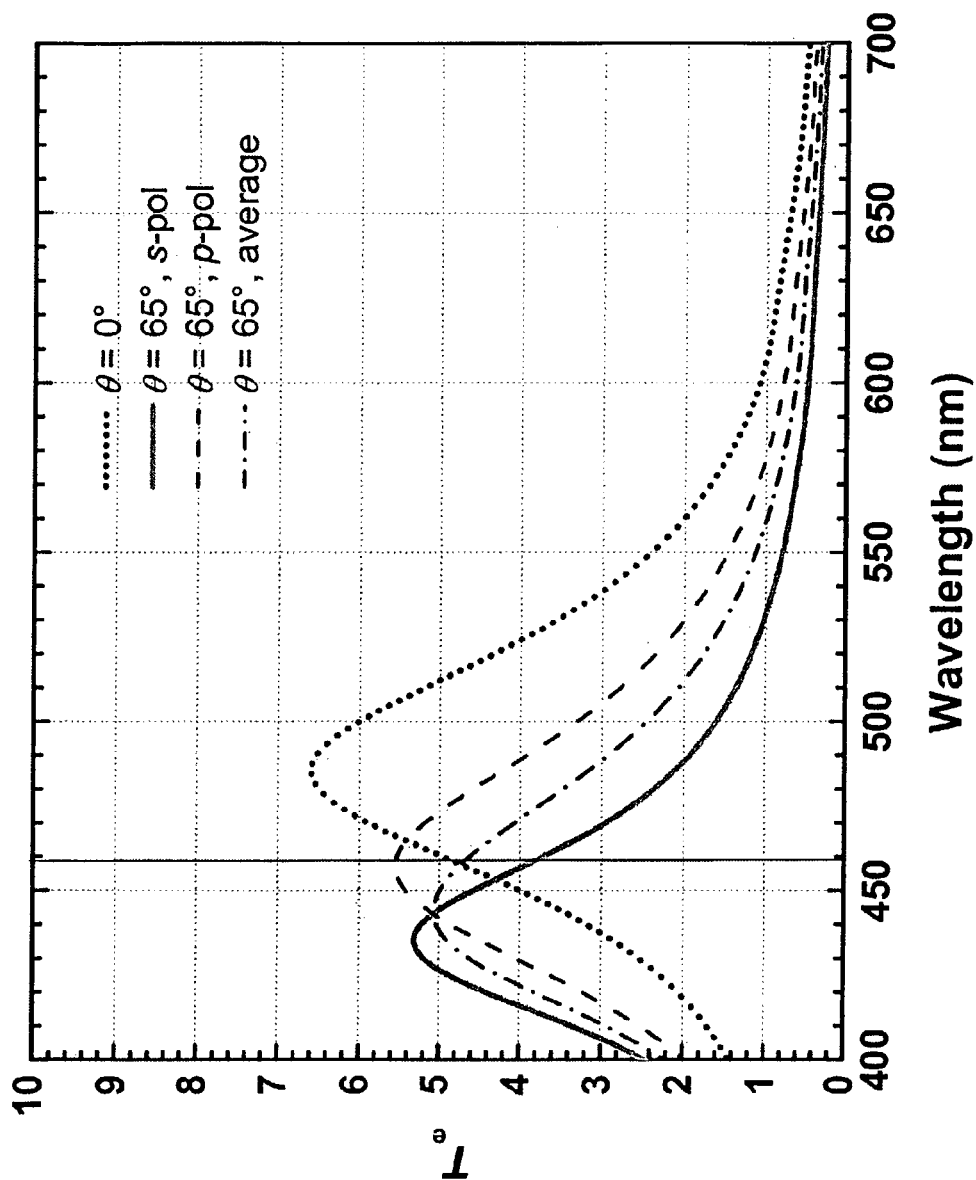
FIG. 12b shows the calculated $T_e$ values of the embodiment B4 in accordance with the present invention at normal and 65° viewing angles for s- and p-polarized light, and for light with average polarization.

Embodiment B4 in accordance with the present invention is similar to embodiment B3. However, the cavity layer thickness has been optimized for the blue wavelength region. FIGS. 12a and 12b illustrate the calculated parameters and performance for this system at normal and 65° viewing angles. The layer structure and thicknesses are listed in Table 2. Clearly, the transmittance in the blue region is much higher than that of embodiment A1 shown in FIG. 5a. In addition, the angular performance of B4 is also good at 65° viewing angle. As before, for practical considerations, only the cavity layer thickness was adjusted for the blue color emitter, thus $\xi_1$ and $\xi_2$ does not reach unity in all wavelength regions. However, if the top multilayer stack could be controlled individually for different color emitters, higher transmittance for the blue region would also be achieved.

Figure 13A:
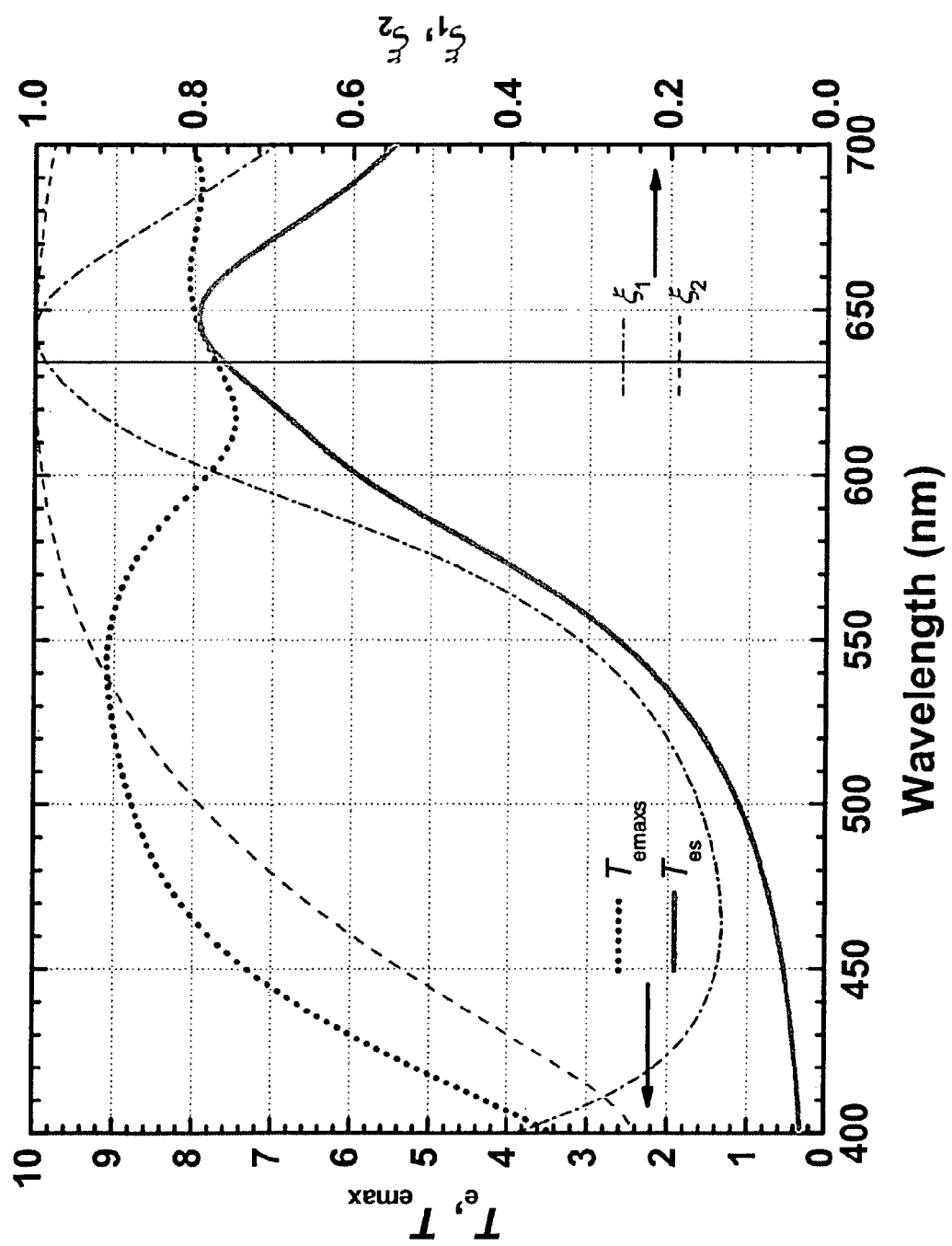
FIG. 13a shows the calculated $T_e$, $T_{emax}$, $\xi_1$, and $\xi_2$ values of the embodiment B5 in accordance with the present invention at normal viewing angle.
Figure 13B:
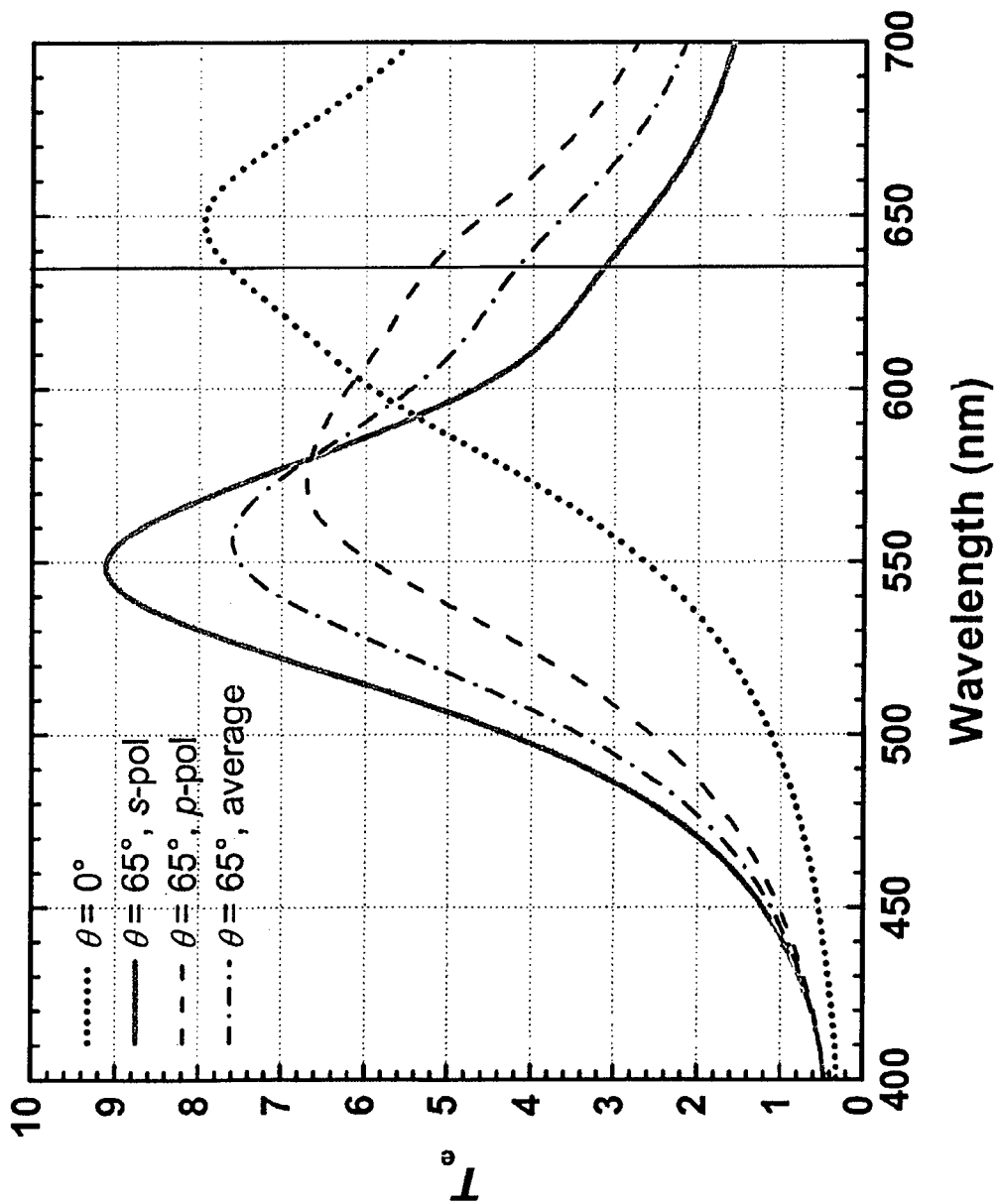
FIG. 13b shows the calculated $T_e$ values of the embodiment B5 in accordance with the present invention at normal and 65° viewing angles for s- and p-polarized light, and for light with average polarization.

Embodiment B5 in accordance with the present invention is similar to embodiment B3. However, the cavity layer thickness has been optimized for the red wavelength region. FIGS. 13a and 13b show the calculated performance and parameters for this system for 0° and 65° viewing angles. The layer structure and thicknesses are listed in Table 2. Clearly, the transmittance in the red region is much higher than that of embodiment A1 shown in FIG. 5a. In addition, the angular performance of B5 is also good at the 65° viewing angle. But, as mentioned before, for practical considerations only the cavity layer thicknesses were allowed to differ in the embodiments B3, B4 and B5 and the original thicknesses of B3 were selected to balance the amount of light emitted at all three different wavelengths. However, if the top multilayer stack could be controlled individually for the different color emitters, a higher transmittance for the red region would also be achieved.

For a full color OLED using the above embodiments B3-B5, the patterning of the silver layer can be done at the same time as patterning the emitting layers. For example, it can be patterned using shadow masks during the deposition.

Third Type of Embodiment

The intent of the third type of embodiments in accordance with the present invention is to obtain OLED devices with good efficiency, good contrast (low external reflectance) and good angular field by introducing in the top multilayer stack additional metal and dielectric layers before- or metal layers after the ITO layer. The layer structure and thicknesses of these added layers are optimized to minimize the external reflectance of the whole OLED structure and at the same time to retain a good efficiency and angular field based on the teachings of the present invention. It should be appreciated that the external reflectance of the structure, that is the reflectance of the whole OLED structure to light impinging on the structure from outside needs to be minimized in order to maximize the contrast of the device, while as noted above the internal reflectance needs to be maximized in order to enhance the microcavity effect.

In embodiment C1 in accordance with the present invention, metal and dielectric layers are added to the top substrate before the ITO layer. The dielectric layers can be made of oxides such as $SiO_2$, $TiO_2$, ZrO2, $AlO_2$, $Nb_2O_5$, $Ta_2O_5$, or fluorites such as $MgF_2$, etc. The metal layers can be made of absorbing metals or metal alloys such as Ni, Inconel™, or semi-conductors such as Si, Ge, etc. Conductive composite metal-dielectric layers can also be used. The layer structure and thicknesses are listed in Table 3. The reflectance and the phase change on internal reflection of the top multilayer in the cavity material were optimized to obtain high values of $\xi_1$ and $\xi_2$ and at the same time to reduce the external reflection of the whole OLED structure. Embodiment C1 has an $Alq_3$ emitting layer, which emits green light.

The additional layers can result in the reduction of light output efficiency, which may be an acceptable trade off for improved contrast, or alternatively the reduction in output efficiency can be compensated for by introducing an additional highly reflective layer with low absorption, preferably silver, at the interface between the top multilayer stack and the cavity layer. The reduction in external reflectance is important to obtain good contrast because as little external light as possible should be reflected from the device.

Figure 14A:
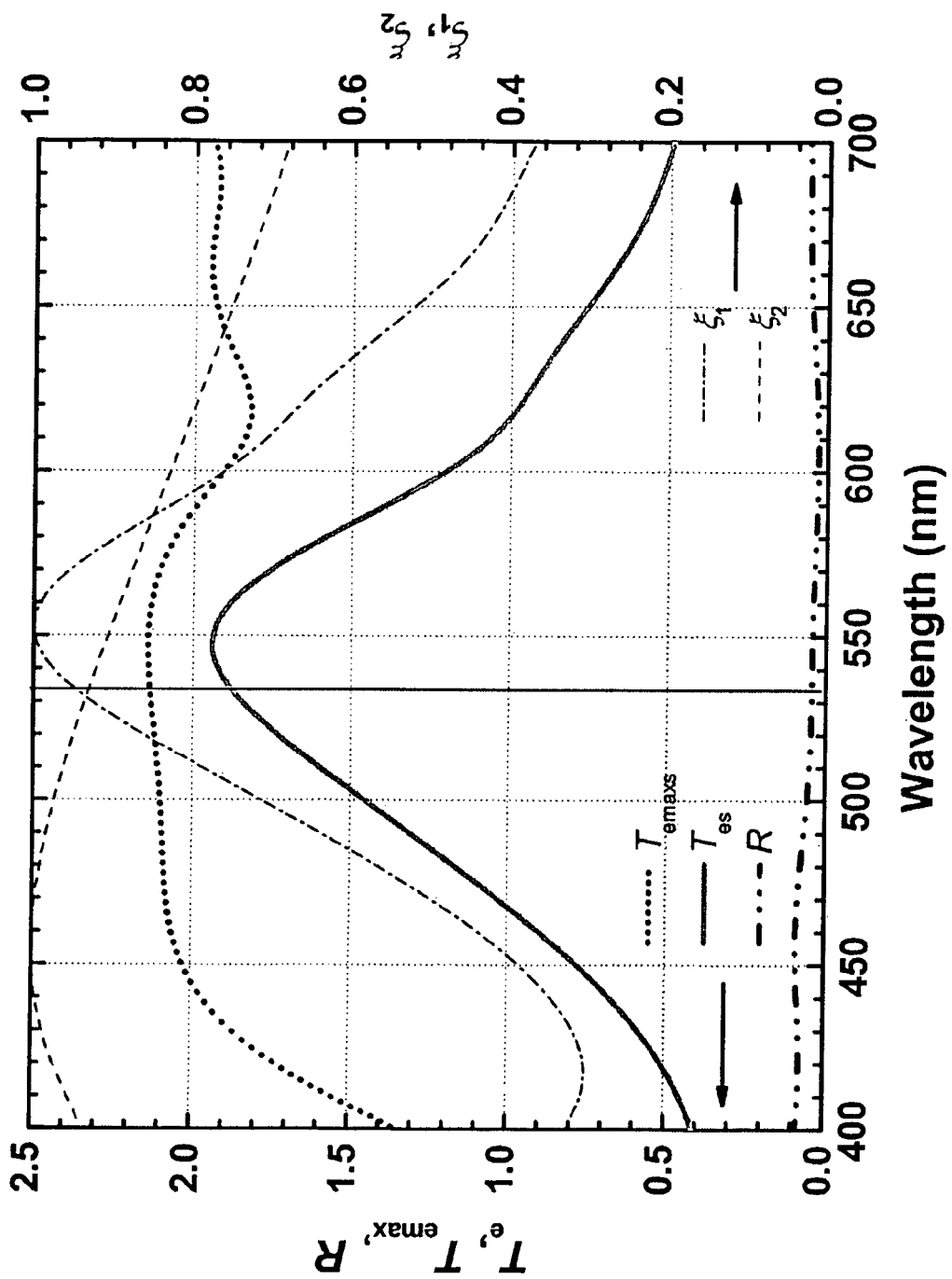
FIG. 14a shows the calculated $T_e$, $T_{emax}$, R, $\xi_1$ and $\xi_2$ values of the embodiment C1 in accordance with the present invention at normal viewing angle.
Figure 14B:
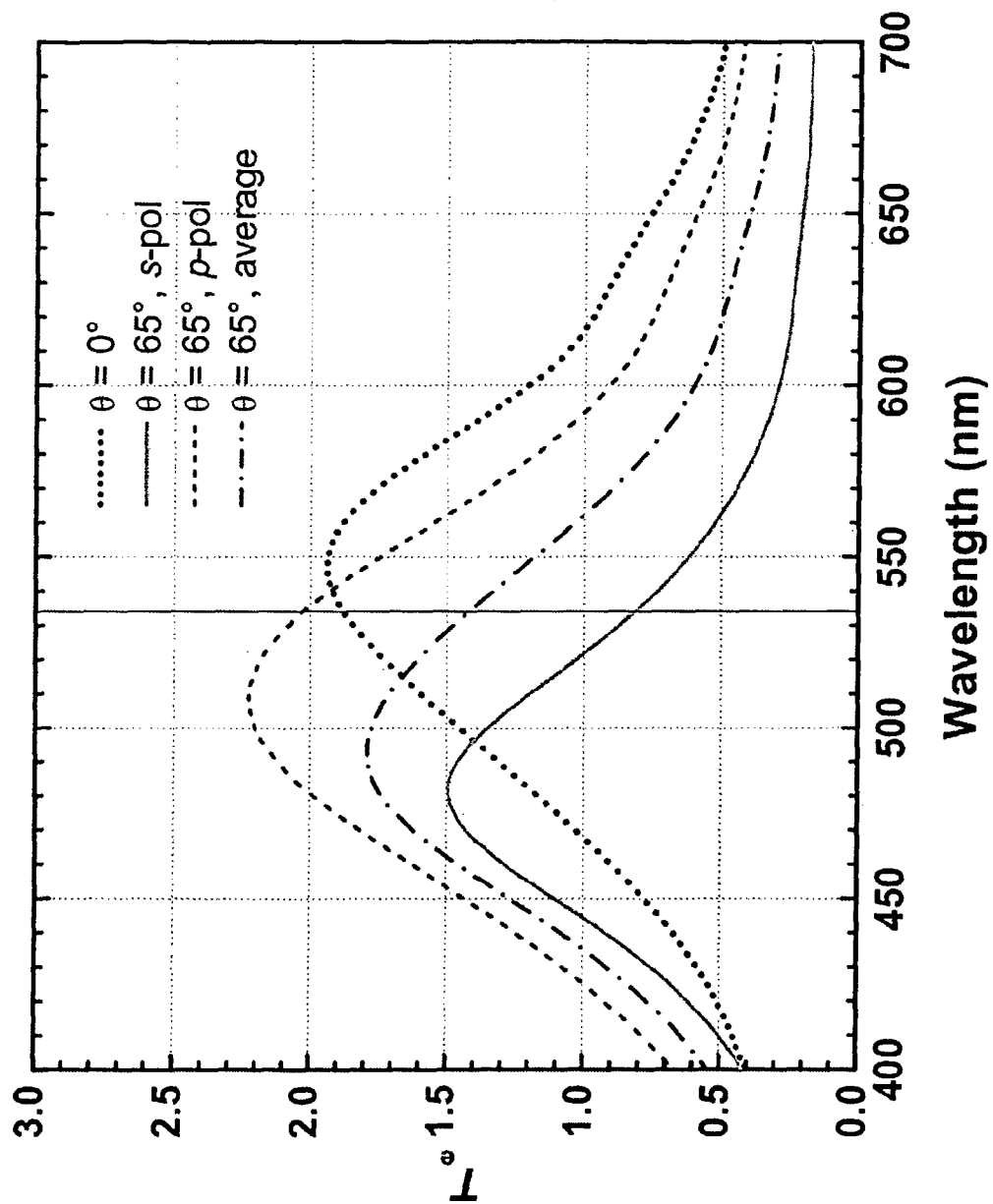
FIG. 14b shows the calculated $T_e$ values of the embodiment C1 in accordance with the present invention at normal and 65° viewing angles for s- and p-polarized light, and for light with average polarization.

FIG. 14a shows the calculated values of the transmittances $T_e$, $T_{emax}$, external reflectance R and of $\xi_1$ and $\xi_2$ of embodiment C1 at a normal viewing angle. The angular performance $T_e$ at 0° and 65° viewing angles in air is shown in FIG. 14b. Clearly, the reflectance of embodiment C1 is low across the whole visible spectrum. Thus, it has good contrast and can be viewed under strong ambient light. In addition, the two phase factors $\xi_1$ and $\xi_2$ are around 0.90. $T_e$ is about 1.8 at the center wavelength. For comparison, a conventional OLED with a good circular polarizer (37% transmission) has a $T_e$ value of between 1.3-1.5.

Figure 15A:
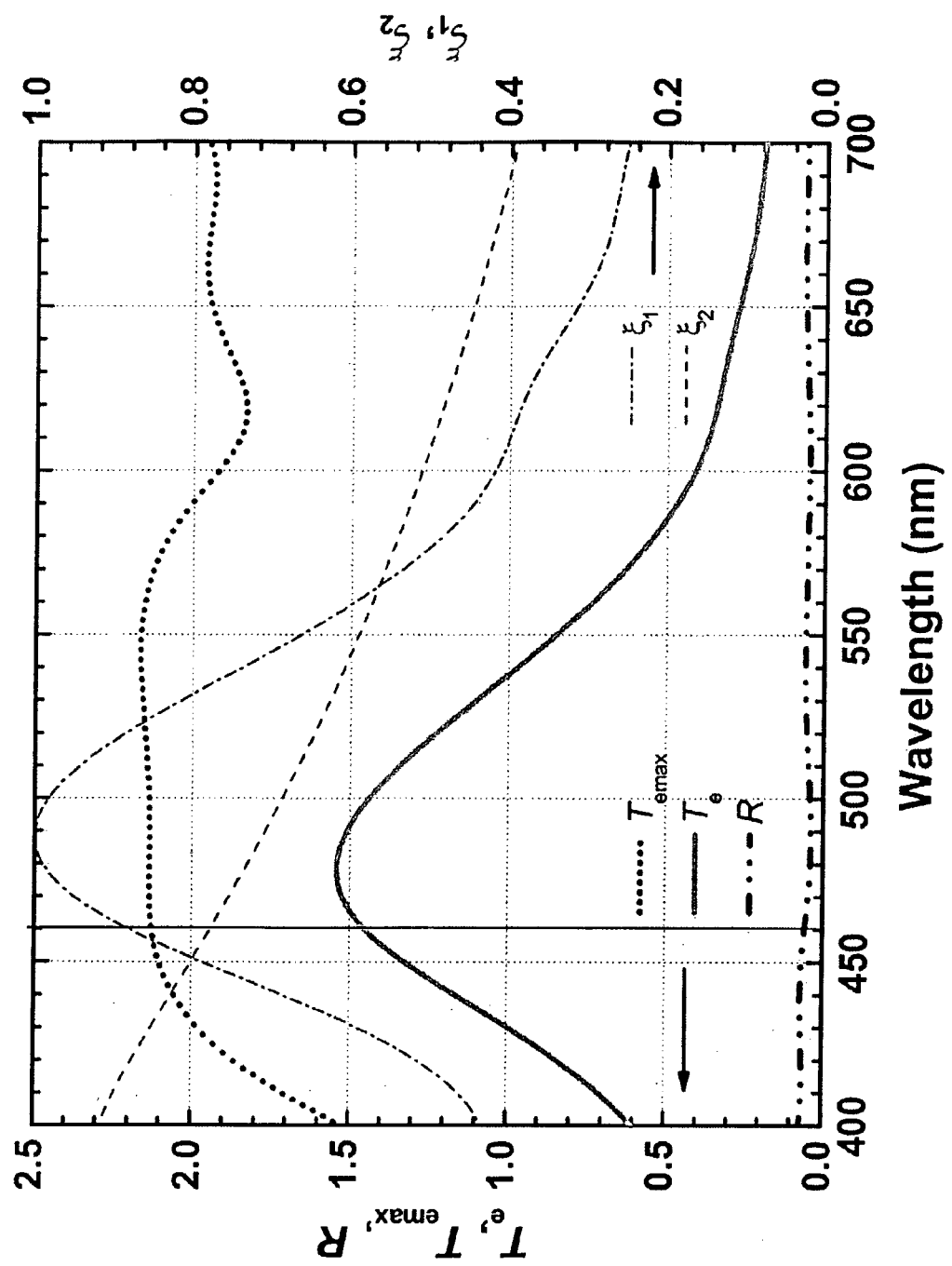
FIG. 15a shows the calculated $T_e$, $T_{emax}$, R, $\xi_1$ and $\xi_2$ values of the embodiment C2 in accordance with the present invention at normal viewing angle.
Figure 15B:
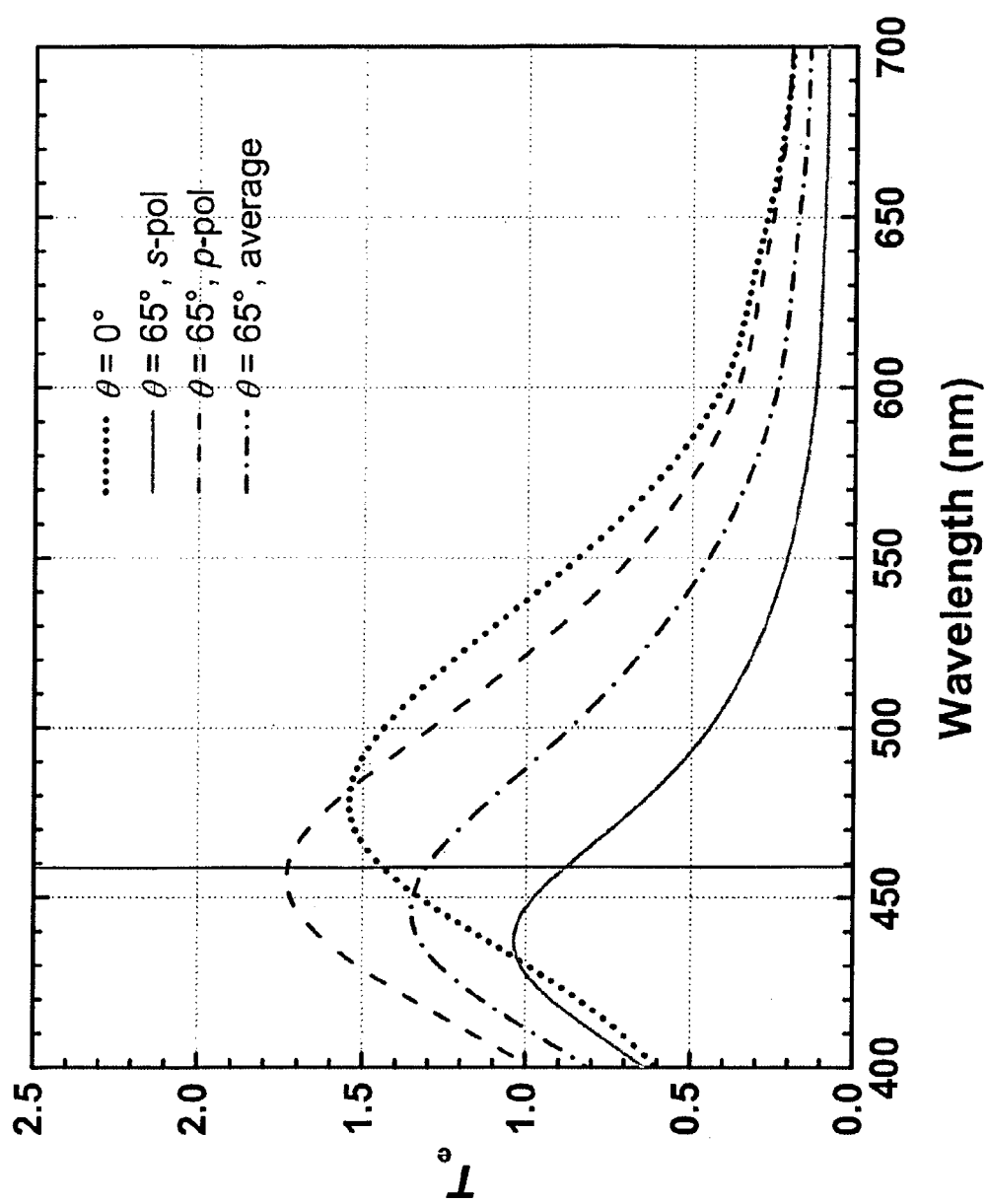
FIG. 15b shows the calculated $T_e$ values of the embodiment C2 in accordance with the present invention at normal and 65° viewing angles for s- and p-polarized light, and for light with average polarization.

Embodiment C2 has a similar layer structure to that of C1, except that the emitting layer thickness has been optimized for a wavelength in the blue spectral region. The layer structure and thicknesses of C2 are listed in Table 3. FIG. 15a shows the calculated values of the transmittances $T_e$, $T_{emax}$, external reflectance R and of $\xi_1$ and $\xi_2$ of embodiment C1 at a normal viewing angle. FIG. 15b show the calculated $T_e$ at normal and 65° viewing angles in air, respectively. Clearly, the transmittance in the blue spectral region is reasonably good and the external reflectance of the whole structure is low both at normal and 65° viewing angles.

Figure 16A:
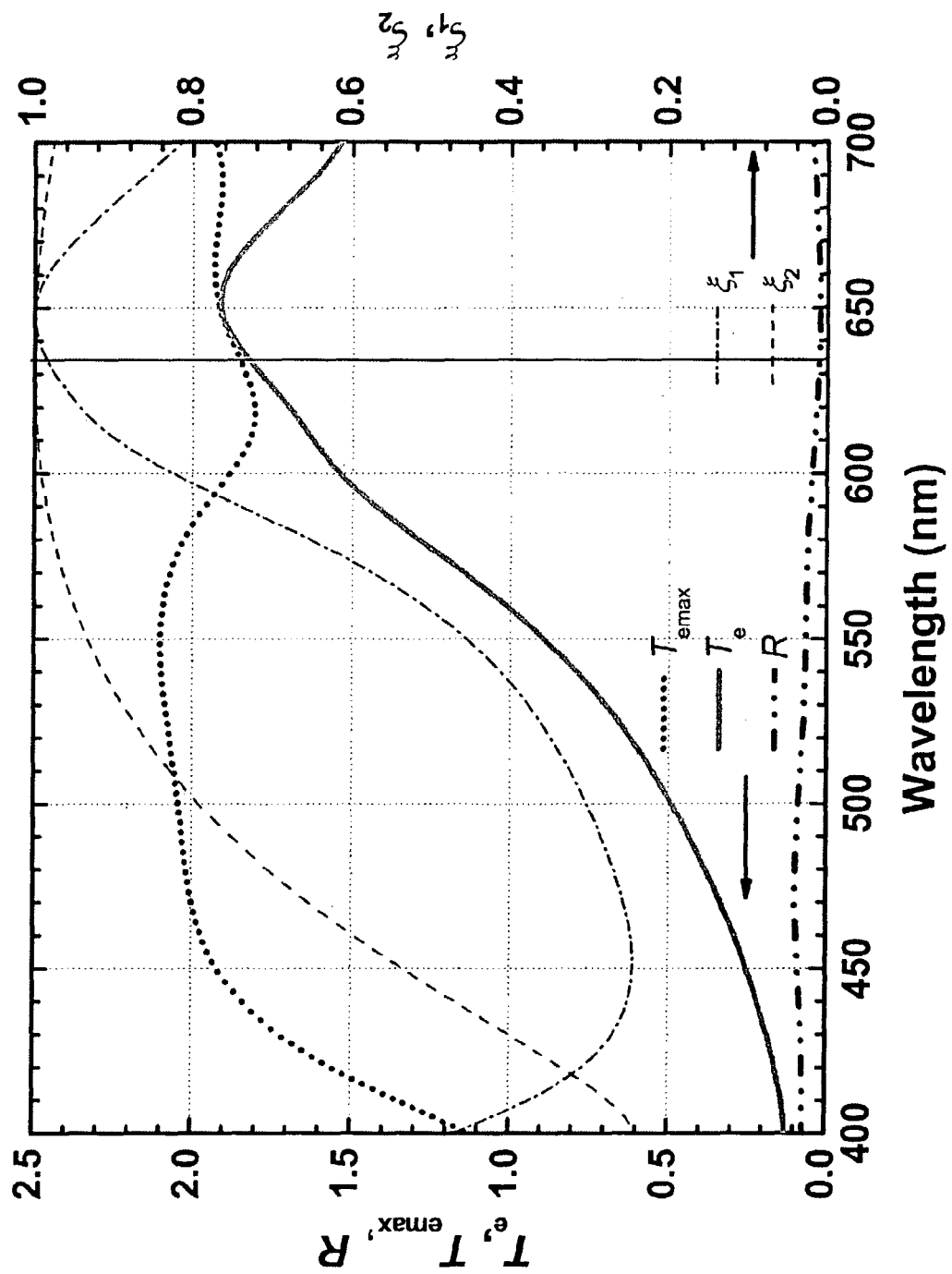
FIG. 16a shows the calculated $T_e$, $T_{emax}$, R, $\xi_1$ and $\xi_2$ values of the embodiment C3 in accordance with the present invention at normal viewing angle.
Figure 16B:
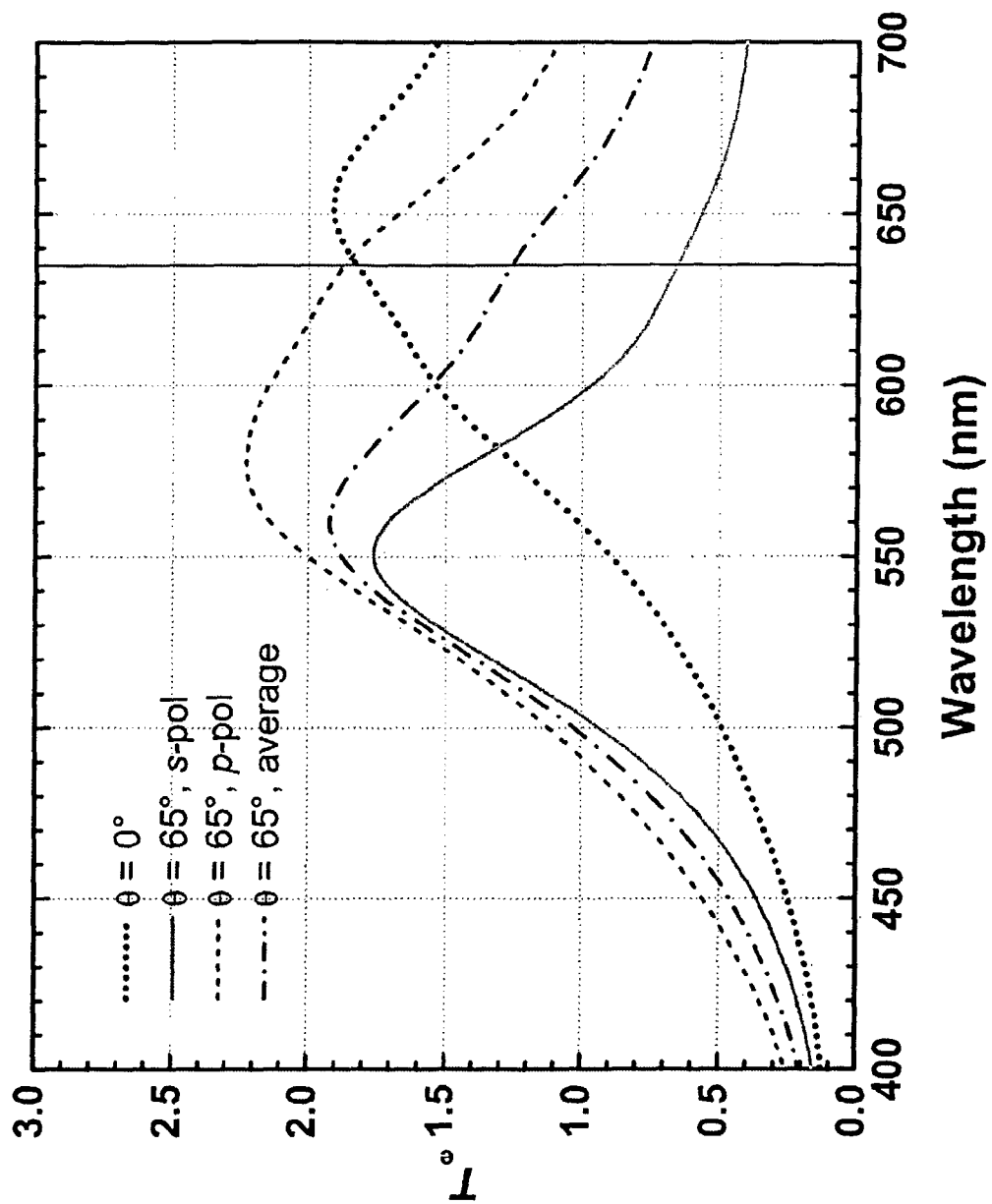
FIG. 16b shows the calculated $T_e$ values of the embodiment C3 in accordance with the present invention at normal and 65° viewing angles for s- and p-polarized light, and for light with average polarization.

Embodiment C3 has a similar layer structure to that of C1, except that the emitting layer thickness has been optimized for a wavelength in the red spectral region. The layer structure and thicknesses of C3 are listed in Table 3. FIG. 15a shows the calculated values of the transmittances $T_e$, $T_{emax}$, external reflectance R and of $\xi_1$ and $\xi_2$ of embodiment C1 at a normal viewing angle. FIG. 16b show the calculated $T_e$ of embodiment C3 at normal and 65° viewing angles in air, respectively. Clearly, the transmittance in the red region is reasonably good and the external reflectance of the whole OLED structure is low both at normal and 65° viewing angles.

Figure 17A:
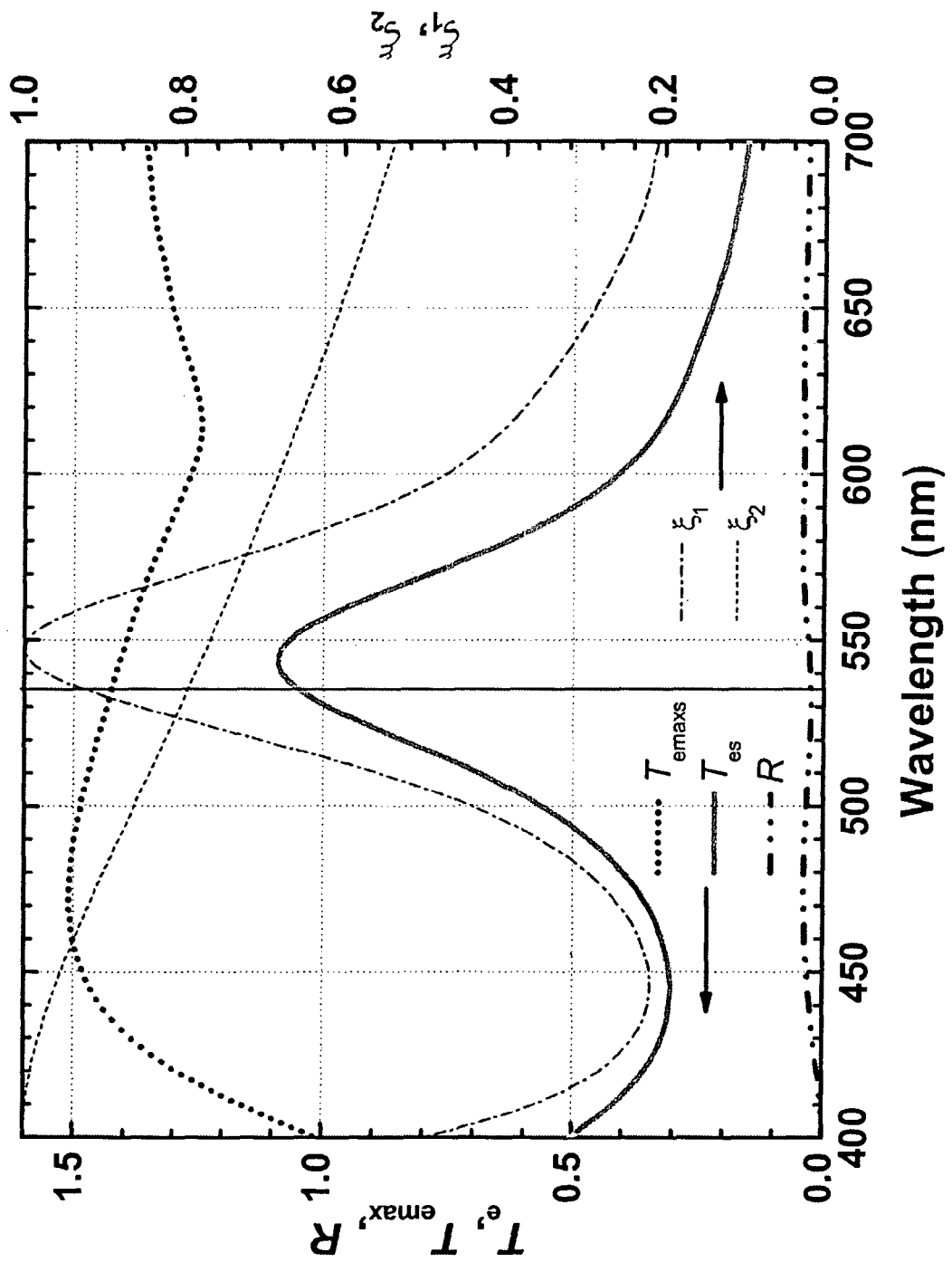
FIG. 17a shows values of $T_e$, $T_{emax}$, R, $\xi_1$ and $\xi_2$, calculated at normal viewing angle, of a conventional OLED with a front black coating and with no phase optimization.
Figure 17B:
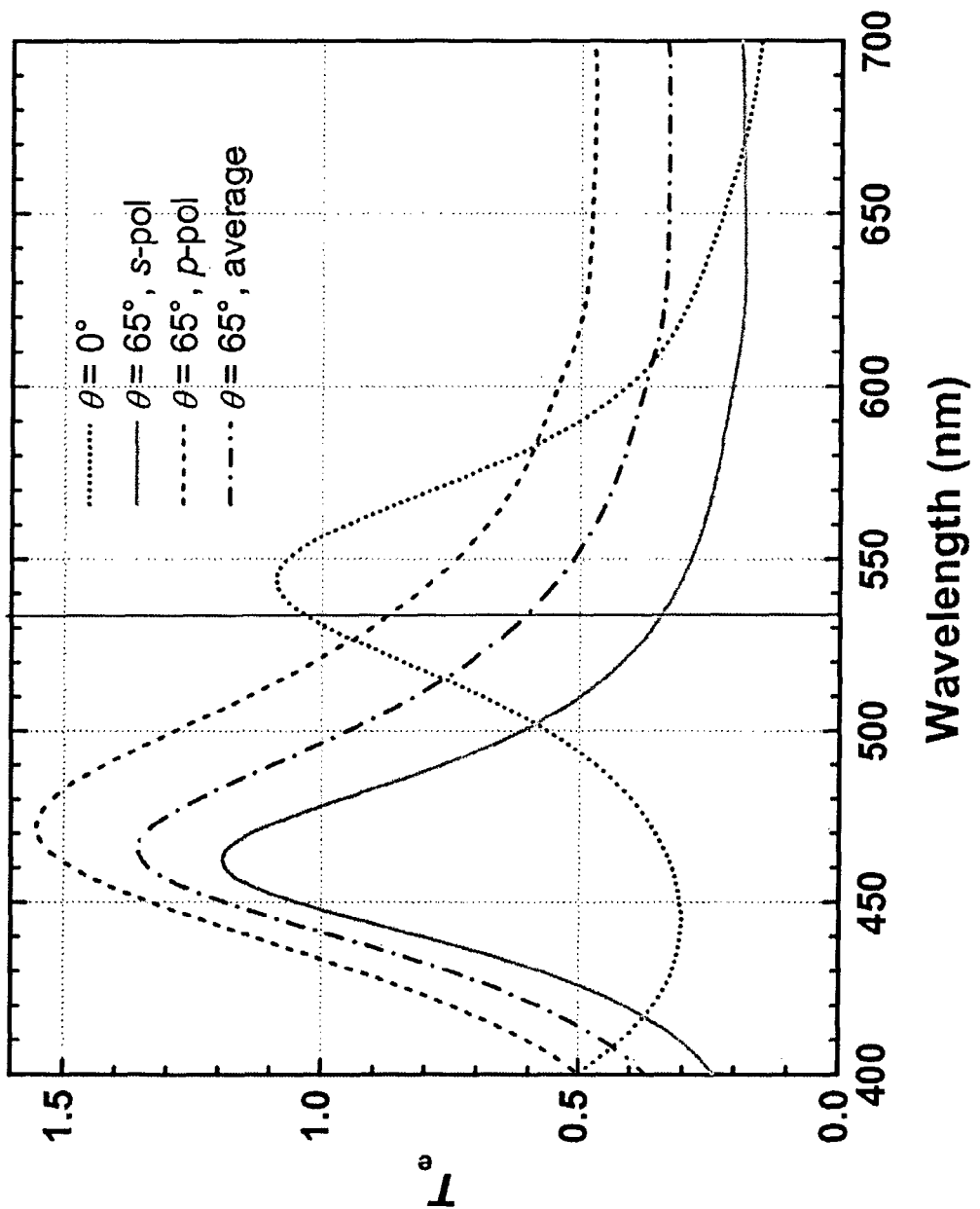
FIG. 17b shows $T_e$ values for a conventional OLED with front black coating and with no phase optimization, calculated at normal and 65° viewing angles for s- and p-polarization and for average polarization.

For comparison, the performance of a conventional OLED structure with a front black coating and with no phase optimization is shown in FIGS. 17a and 17b. Its layer structure and layer thicknesses are listed in Table 3. This OLED device has a structure similar to embodiment C1. However, its transmittance at the peak wavelength is only about 1.1, much less than the 1.8 of embodiment C1. This demonstrates the big difference in terms of the performance of the OLED devices with and without phase control.

Without departing from the spirit of the present invention, more embodiments using other materials or layer structures other than the ones demonstrate above can also be realized. In addition, the structure and layer thicknesses need to be determined on the basis of actual optical constants of the materials used in the device. Those optical constants may not be the same as the ones used in the above embodiments.

TABLE 1

Description of the OLEDs structures related to the first type of embodiments

| Layer sequence | Material | Conventional OLED (FIG. 6) | Embodiment A1 (FIG. 5) | Embodiment A2 (FIG. 7) | Embodiment A3 (FIG. 8) |
|---|---|---|---|---|---|
| 1 | Al | Opaque | Opaque | Opaque | Opaque |
| 2 | LiF | 0.5 | 0.5 | 0.5 | 0.5 |
| 3 | $Alq_3$ | 50.0 | 73.7 | 50.0 | 90.0 |
| 4 | NPB | 50.0 | 45.2 | 45.2 | 45.2 |
| 5 | CuPC | 15.0 | 10.2 | 10.2 | 10.2 |
| 6 | ITO | 100.0 | 80.3 | 80.3 | 80.3 |
| 7 | Glass | Substrate (optional) | Substrate (optional) | Substrate (optional) | Substrate (optional) |

TABLE 2

Description of the OLEDs structures related to the second type of embodiments

| Layer sequence | Material | Embodiment B1 (FIG. 9) | Embodiment B2 (FIG. 10) | Embodiment B3 (FIG. 11) | Embodiment B4 (FIG. 12) | Embodiment B5 (FIG. 13) |
|---|---|---|---|---|---|---|
| 1 | Al | Opaque | Opaque | Opaque | Opaque | Opaque |
| 2 | LiF | 0.5 | 0.5 | 0.5 | 0.5 | 0.5 |
| 3 | $Alq_3$ | 73.7 | 73.7 | 60.0 | 40.0 | 90.0 |
| 4 | NPB | 40.0 | 45.0 | 45.0 | 45.0 | 45.0 |
| 5 | CuPC | 10.0 | 10.0 | 10.0 | 10.0 | 10.0 |
| 6 | Ag | — | — | 15.0 | 15.0 | 15.0 |
| 7 | ITO | 85.0 | 80.0 | 80.0 | 80.0 | 80.0 |
| 8 | $SiO_2$ | 90.2 | 166.4 | — | — | — |
| 9 | $TiO_2$ | 111.2 | 7.8 | — | — | — |
| 10 | $SiO_2$ | — | 16.8 | — | — | — |
| 11 | $TiO_2$ | — | 226.4 | — | — | — |
| 12 | $SiO_2$ | — | 32.9 | — | — | — |
| 13 | $TiO_2$ | — | 14.2 | — | — | — |
| 14 | Glass | Substrate (optional) | Substrate (optional) | Substrate (optional) | Substrate (optional) | Substrate (optional) |

TABLE 3

Description of the OLEDs structures related to the third type of embodiments

| Layer sequence | Material | Embodiment C1 (FIG. 14) | Embodiment C2 (FIG. 15) | Embodiment C3 (FIG. 16) | Non-optimized black OLED (FIG. 17) |
|---|---|---|---|---|---|
| 1 | Al | Opaque | Opaque | Opaque | Opaque |
| 2 | LiF | 0.5 | 0.5 | 0.5 | 0.5 |
| 3 | $Alq_3$ | 60.0 | 40.0 | 90.0 | 50.0 |
| 4 | NPB | 45.0 | 45.0 | 45.0 | 50.0 |
| 5 | CuPC | 10.0 | 10.0 | 10.0 | 15.0 |
| 6 | Ag | 10.0 | 10.0 | 10.0 | — |
| 7 | ITO | 80.0 | 80.0 | 80.0 | 100.0 |
| 8 | $SiO_2$ | 167.3 | 167.3 | 167.3 | 80.0 |
| 9 | Inconel8 | 2.9 | 2.9 | 2.9 | 9.4 |
| 10 | $SiO_2$ | 82.0 | 82.0 | 82.0 | 86.4 |
| 11 | Inconel8 | 4.3 | 4.3 | 4.3 | 5.0 |
| 12 | $SiO_2$ | 85.3 | 85.3 | 85.3 | — |
| 13 | Inconel8 | 2.1 | 2.1 | 2.1 | — |
| 14 | Glass | Substrate (optional) | Substrate (optional) | Substrate (optional) | Substrate (optional) |

We claim:

1. A light emitting device comprising:
   a layered structure comprising a cavity layer containing a light emitting region sandwiched between passive bottom and top multilayer stacks, said passive bottom and top multilayer stacks being devoid of a light emitting layer;
   wherein the passive bottom multilayer stack includes a cathode and the passive top multilayer stack includes a hole transport layer and a transparent anode,
   wherein the passive top multilayer stack includes an additional functional layer group for increasing an internal reflectance of the passive top multilayer stack and the passive bottom multilayer stack includes an additional functional layer group for reducing reflectance from the cathode;
   wherein a top transparent substrate through which light is emitted from the device is located above the top multilayer stack; and
   wherein said layered structure is constructed such that the product of phase factors $\xi_1$ and $\xi_2$ is greater than 80% at the center of at least one light emitting region and for a normal viewing angle, wherein $$\xi_1 = \left(1 + \frac{4\sqrt{R_a^- R_b^+}\sin^2\left(\alpha_1 - \frac{\varphi_a^- + \varphi_b^+}{2}\right)e^{-2\beta_1}}{\left(1 - \sqrt{R_a^- R_b^+}\,e^{-2\beta_1}\right)^2}\right)^{-1}$$

$$\xi_2 = 1 - \frac{4\sqrt{R_b^+}\sin^2\left(\alpha_2 - \frac{\varphi_b^+}{2}\right)e^{-2\beta_2}}{\left(1 + \sqrt{R_b^+}\,e^{-2\beta_2}\right)^2}$$

$$\begin{cases} \delta_1 = \frac{2\pi}{\lambda}(n-ik)d\cos\theta_{cavity} = \frac{2\pi}{\lambda}nd\cos\theta_{cavity} - i\frac{2\pi}{\lambda}kd\cos\theta_{cavity} = \\ \qquad \alpha_1 - i\beta_1 \\ \delta_2 = \frac{2\pi}{\lambda}(n-ik)x\cos\theta_{cavity} = \frac{2\pi}{\lambda}nx\cos\theta_{cavity} - i\frac{2\pi}{\lambda}kx\cos\theta_{cavity} = \\ \qquad \alpha_2 - i\beta_2 \end{cases}$$

where $R_a^-$ and $R_b^+$ are the reflectance of the passive top and bottom multilayer stacks respectively, $\phi_a^-$ and $R_b^+$ are phase changes on reflection for the passive top and bottom multilayer stacks respectively, $\alpha_1$ and $\beta_1$ are respectively the real and imaginary parts of a phase thickness, $\delta_1$, of said cavity layer, $\alpha_2$ and $\beta_2$ are respectively the real and imaginary parts of the phase thickness, $\delta_2$, of said light-emitting region at an operating wavelength, $\lambda$, of the light emitting device, x is the mean distance of said light emitting region from the passive bottom multilayer stack, n and k are respectively a refractive index and an absorption coefficient of said cavity layer, $\theta_{cavity}$ is the emitting angle inside the cavity layer, and d is a physical thickness of said cavity layer.

2. The light emitting device as claimed in claim 1, wherein said product is greater than or equal to 90% at the center of at least one emitting region and for the normal viewing angle.

3. The light emitting device as claimed in claim 1, wherein said product is greater than or equal to 95% at the center of at least one emitting region and for the normal viewing angle.

4. The light emitting device as claimed in claim 1, wherein the passive top multilayer stack has the structure Al/LiF/Alq3/NPB/CuPc/ITO.

5. The light emitting device as claimed in claim 4, further comprising a glass substrate.

6. The light emitting device as claimed in claim 1, wherein said at least one additional functional layer group in the top multilayer stack includes a dielectric layer between said anode and the top transparent substrate.

7. The light emitting device as claimed in claim 6, wherein said at least one additional functional layer group in the top multilayer stack comprises alternating layers of dielectric material of different refractive index.

8. The light emitting device as claimed in claim 7, wherein said alternating layers comprise $SiO_2$ and $TiO_2$.

9. The light emitting device as claimed in claim 1, wherein said at least one additional functional layer group in the top multilayer stack comprises a layer of conductive material with a reflection and an absorption between said anode and said cavity layer.

10. The light emitting device as claimed in claim 9, wherein said layer of conductive material is a metal.

11. The light emitting device as claimed in claim 9, wherein said layer of conductive material is silver.

12. The light emitting device as claimed in claim 1, wherein said passive top multilayer stack includes an absorbent layer group above said anode to decrease the external reflectance of said top multilayer stack.

13. The light emitting device as claimed in claim 12, wherein said absorbent layer group comprises a mixture of metal and dielectric.

14. The light emitting device as claimed in claim 12, wherein said absorbent layer group comprises a semiconductor.

15. The light emitting device as claimed in claim 12, wherein said absorbent layer group comprises alternate alternating layers of metal and dielectric.

16. The light emitting device as claimed in claim 12, further comprising a layer of conductive material with an absorption and a reflectance in said top multilayer stack adjacent said cavity layer.

17. The light emitting device as claimed in claim 16, wherein said conductive material is silver.

18. The light emitting device as claimed in claim 15, wherein said alternating dielectric layers comprise nickel alloy and $SiO_2$.

19. The light emitting device as claimed in claim 1, wherein said light emitting device is an OLED.

20. A method of making a light emitting device comprising:
providing a layered structure comprising a cavity layer containing an active light emitting region sandwiched between passive bottom and top multilayer stacks, said passive top and bottom multilayer stacks being devoid of a light emitting layer, wherein the passive bottom multilayer stack includes a cathode and the passive top multilayer stack includes a hole transport layer and a transparent anode layer, the passive top multilayer stack includes an additional functional layer group for increasing an internal reflectance of the top layer stack and the passive bottom multilayer stack includes an additional functional layer group for reducing reflectance from the cathode; and
providing, above the passive top multilayer stack, a top transparent substrate through which light is emitted from the device; and
wherein thicknesses of said layered structure are selected such that the product of phase factors $\xi_1$ and $\xi_2$ is greater than 80% at the center of at least one light emitting region and for a normal viewing angle, wherein $$\xi_1 = \left(1 + \frac{4\sqrt{R_a^- R_b^+}\sin^2\left(\alpha_1 - \frac{\varphi_a^- + \varphi_b^+}{2}\right)e^{-2\beta_1}}{\left(1 - \sqrt{R_a^- R_b^+}\,e^{-2\beta_1}\right)^2}\right)^{-1}$$

$$\xi_2 = 1 - \frac{4\sqrt{R_b^+}\sin^2\left(\alpha_2 - \frac{\varphi_b^+}{2}\right)e^{-2\beta_2}}{\left(1 + \sqrt{R_b^+}\,e^{-2\beta_2}\right)^2}$$

$$\begin{cases} \delta_1 = \frac{2\pi}{\lambda}(n-ik)d\cos\theta_{cavity} = \frac{2\pi}{\lambda}nd\cos\theta_{cavity} - i\frac{2\pi}{\lambda}kd\cos\theta_{cavity} = \\ \qquad \alpha_1 - i\beta_1 \\ \delta_2 = \frac{2\pi}{\lambda}(n-ik)x\cos\theta_{cavity} = \frac{2\pi}{\lambda}nx\cos\theta_{cavity} - i\frac{2\pi}{\lambda}kx\cos\theta_{cavity} = \\ \qquad \alpha_2 - i\beta_2 \end{cases}$$

where $R_a^-$ and $R_b^+$ are the reflectance of the passive top and bottom multilayer stacks respectively, $\phi_a^-$ and $\phi_b^+$ are the phase changes on reflection for the top and bottom multilayer stacks respectively, $\alpha_1$ and $\beta_1$ are respectively the real and imaginary parts of the phase thickness, $\delta_1$, of said cavity layer, $\alpha_2$ and $\beta_2$ are respectively the real and imaginary parts of the phase thickness, $\delta_2$, of said light-emitting region at an operating wavelength, $\lambda$, of the light emitting device, and x is the mean distance of said light emitting region from the passive bottom multilayer stack, n and k are respectively a refractive index and an absorption coefficient of said cavity and d is a physical thickness is the emitting angle inside the cavity layer, layer, $\theta_{cavity}$, of said cavity layer.

21. The method as claimed in claim 20, wherein said product of the phase factors $\xi_1$ and $\xi_2$ is greater than or equal to 90% at the center of at least one emitting wavelength region and for the normal viewing angle.

22. The method as claimed in claim 20, wherein said product of the phase factors $\xi_1$ and $\xi_2$ is greater than or equal to 95% at the center of at least one emitting wavelength region and for the normal viewing angle.

23. The method as claimed in claim 20, wherein the reflectance of the passive top multilayer stack and phase changes occurring upon reflection from said passive top multilayer stack in said cavity layer are controlled with said additional functional layer group in said passive top multilayer stack.

24. The method as claimed in claim 23, wherein said additional functional layer group in said passive top multilayer stack comprises alternating dielectric layers above the transparent anode layer in said passive top multilayer stack.

25. The method as claimed in claim 24, wherein said alternating dielectric layers are $SiO_2$ and $TiO_2$.

26. The method as claimed in claim 20, comprising reducing the external reflectance of the passive top multilayer stack with at least one absorption layer group in said top multilayer stack.

27. The method as claimed in claim 26, further comprising including a reflective conductive layer on the inside of said passive top multilayer stack to enhance the reflectance within said cavity layer and compensate for a reduction in efficiency caused by said absorption layer group.

28. The method as claimed in claim 27, wherein said at least one absorption layer group comprises a mixture of metal and dielectric.

29. The method as claimed in claim 28, wherein said at least one absorption layer group comprises a semiconductor.

30. The method as claimed in claim 26, wherein said at least one absorption layer group comprises alternating dielectric and metal layers.

31. The method as claimed in claim 27, wherein said reflective conductive layer is a metal.

32. The method as claimed in claim 31, wherein said metal is silver.

\* \* \* \* \*